United States Patent
Taghizadeh Ansari et al.

(10) Patent No.: US 11,012,113 B2
(45) Date of Patent: May 18, 2021

(54) COMPOSITE RIGHT-HAND LEFT-HAND DISTRIBUTED ATTENUATOR

(71) Applicants: Kimia Taghizadeh Ansari, Ottawa (CA); Tyler Neil Ross, Ottawa (CA)

(72) Inventors: Kimia Taghizadeh Ansari, Ottawa (CA); Tyler Neil Ross, Ottawa (CA)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 8 days.

(21) Appl. No.: 16/146,036

(22) Filed: Sep. 28, 2018

(65) Prior Publication Data
US 2020/0106476 A1    Apr. 2, 2020

(51) Int. Cl.
| H03H 11/24 | (2006.01) |
| H04B 3/14 | (2006.01) |
| H03H 7/075 | (2006.01) |
| H04B 3/32 | (2006.01) |

(52) U.S. Cl.
CPC ............ *H04B 3/145* (2013.01); *H03H 7/075* (2013.01); *H03H 11/24* (2013.01); *H04B 3/32* (2013.01)

(58) Field of Classification Search
CPC ........ H03H 11/245; H03H 11/24; H03H 7/24; H03H 7/25; H03H 7/253; H03H 7/255; H03H 7/256; H03H 7/075; H04B 3/145
USPC .............................................. 333/81 A, 81 R
See application file for complete search history.

(56) References Cited

U.S. PATENT DOCUMENTS

| 5,309,048 A * | 5/1994 | Khabbaz | H03H 11/245 327/306 |
| 5,448,207 A * | 9/1995 | Kohama | H03H 11/245 333/81 R |
| 2003/0132814 A1 * | 7/2003 | Nyberg | H01P 1/227 333/81 R |

(Continued)

FOREIGN PATENT DOCUMENTS

| CN | 104518754 A | 4/2015 |
| CN | 106411288 A | 2/2017 |
| EP | 2337219 A1 | 6/2011 |

OTHER PUBLICATIONS

Jianhong Xiao et al, A High Dynamic Range CMOS Variable Gain Amplifier for Mobile DTV Tuner, IEEE Journal of Solid-State Circuits, vol. 42, No. 2, Feb. 2007.

(Continued)

*Primary Examiner* — Stephen E. Jones

(57) ABSTRACT

A variable loss attenuator is provided. Two or more controllable stages each include a differential or single-ended π network. Each π network includes one or more series elements connected in series between the signal input and the signal output. Each series element includes a series transistor, which may potentially be provided without an inductor in parallel. Each π network includes a plurality of shunt elements each including at least one respective shunt transistor. An input stage connects to the first controllable stage and an output stage connects from the last controllable stage. Intermediate stages connect the controllable stages to one another. Each of the input stage, output stage, and intermediate stages include a right-handed transmission line component and coupled between the signal input and a first one of the controllable stages. Shunt inductors are located at inputs and outputs of each of the controllable stages.

20 Claims, 20 Drawing Sheets

(56) References Cited

U.S. PATENT DOCUMENTS

2011/0285481 A1 11/2011 Huang et al.
2018/0287589 A1* 10/2018 Madsen ............... H03H 11/245

OTHER PUBLICATIONS

Min, B.-W. and Rebeiz, G. M., A 10-50-GHz CMOS distributed step attenuator with low loss and low phase imbalance, IEEE Journal of Solid-State Circuits, vol. 42, No. 11, Nov. 2007.
Kuo, C.-C. et al., A 71-76 GHz CMOS Variable Gain Amplifier Using Current Steering Technique, IEEE RFIC Symp., 2008.
Ross, T. N, Ansari, K. T., Tiller, S. and Repeta, M., A 5-bit, 0.25 dB Step Variable Attenuator at E-Band, Proc. IEEE RFIC Symp., 2018.
U.S. Appl. No. 15/802,905, Kimia Ansari and Tyler Ross filed 2017.
U.S. Appl. No. 15/808,603, Sam Tiller, Kimia T. Ansari and Tyler Ross filed 2017.

* cited by examiner

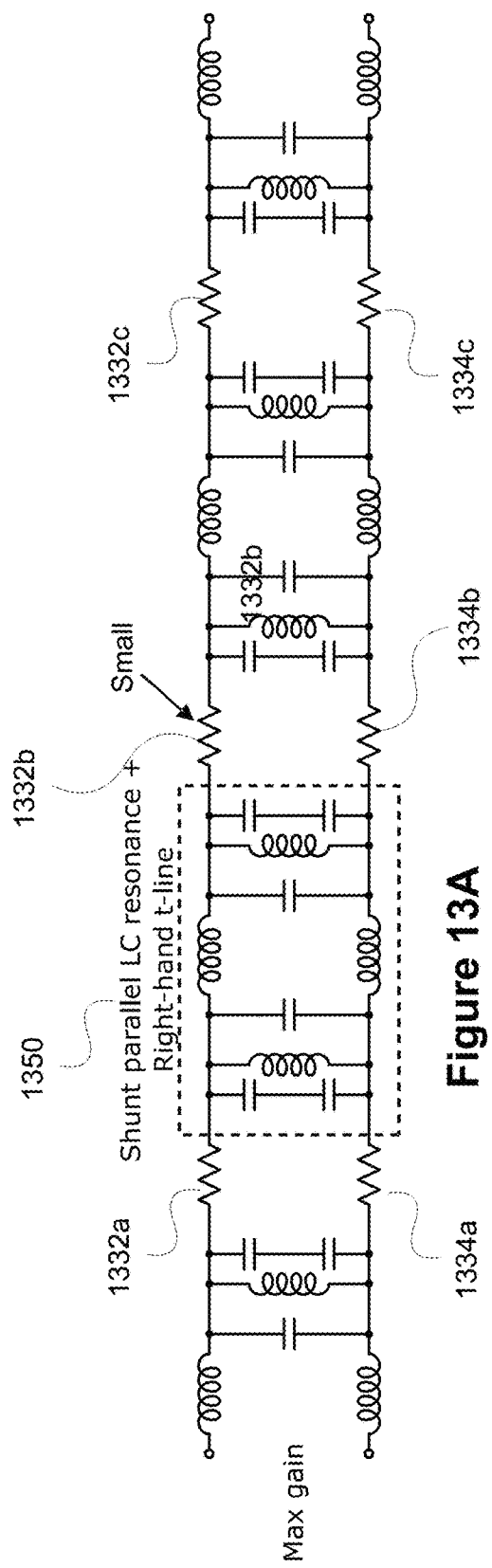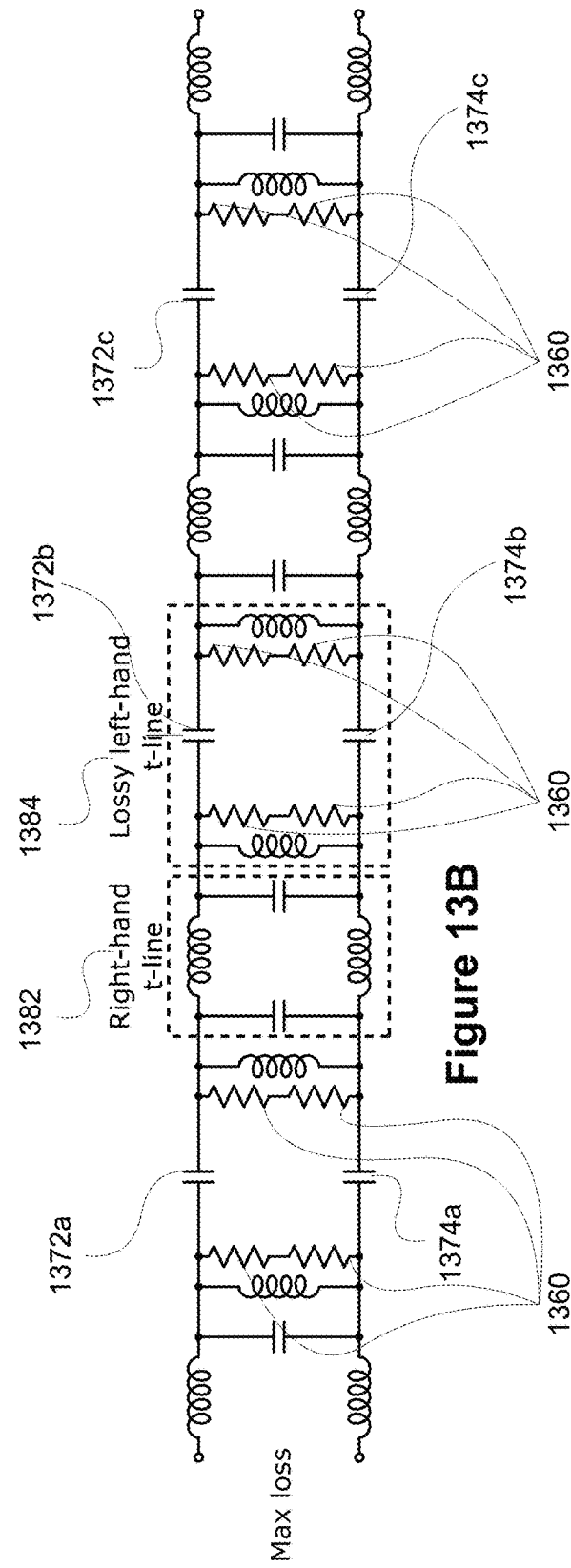

COMPOSITE RIGHT-HAND LEFT-HAND DISTRIBUTED ATTENUATOR

FIELD OF THE INVENTION

The present invention pertains in general to the field of amplifiers and attenuators, for example at radio frequencies (RF), and in particular to distributed variable loss attenuators for controlling signal levels across a wide bandwidth in communication equipment.

BACKGROUND

In receivers, such as those used in various portable electronic devices and base stations communicating via radio frequency (RF), it is often necessary to attenuate received signals before providing the attenuated signal to more sensitive receiver components for proper signal processing. Additionally, in the corresponding transmitters, it is often useful to control the transmitted signal to have less power, in order to avoid excessive interference with other equipment. A variable attenuator circuit is useful for this task, and can be used to adjust the signal level and to improve the dynamic range of RF transceivers.

In most receivers and transmitters, it is generally desirable to have high linearity and low distortion, particularly over a wide range of signals. Hence, these characteristics are desirable when designing a variable loss attenuator for a communication system in which signals are transmitted and received over a wide range of power levels. However, variable loss attenuators having a wide bandwidth are difficult to design.

The paper "A 5-bit, 0.25 dB Step Variable Attenuator at E-Band," by T. Ross, K. Ansari, S. Tiller and M. Repeta, IEEE Radiofrequency Integrated Circuits Symposium, June 2018, discloses a variable attenuator as illustrated in FIG. 1. The variable attenuator is described as operating over 71 GHz to 76 GHz, and is designed based on a differential π network with transistors being used as variable resistors. However, the arrangement of the circuit (including the 250 pH inductors provided in parallel with the series transistors) results in an LC resonance circuit that tends to limit the circuit bandwidth.

The paper "A 10-50-GHz CMOS Distributed Step Attenuator With Low Loss and Low Phase Imbalance," by B. Min and G. Rebeiz, IEEE Journal of Solid-State Circuits, Vol. 2, No. 11, November 2007, discloses an attenuator approach in which a transmission line is periodically loaded with attenuating elements (e.g. varistors) as shown in FIG. 2. This topology allows the transistors' parasitic capacitances being absorbed into the transmission line, and thus it is improving the bandwidth. However, attaching varistors to a transmission line in this manner tends to distort the matching of the circuit and degrade the return loss, because the value of the varistor should be very small when a large range of attenuation is desired, and this significantly affects the input return loss. To achieve a desirable attenuation range, either the varistors should be allowed to become small, or a large number of unit cells are used. However, use of small varistors undesirably degrades return loss, while cascading a large number of unit cells undesirably increases the minimum loss of the attenuator.

Therefore there is a need for a well-matched, wide bandwidth variable loss attenuator (e.g. operable at RF or millimeter-wave frequencies) and corresponding method that obviates or mitigates one or more limitations of the prior art.

This background information is provided to reveal information believed by the applicant to be of possible relevance to the present invention. No admission is necessarily intended, nor should be construed, that any of the preceding information constitutes prior art against the present invention.

SUMMARY

An objective of embodiments of the present invention is to provide a variable loss (RF) attenuator, such as a composite right-hand left-hand distributed attenuator. In accordance with an embodiment of the present invention, there is provided a variable loss attenuator (e.g. RF attenuator) comprising: a signal input; an input stage; a signal output; an output stage; two or more controllable stages; and one or more intermediate stages. Each controllable stage includes a differential (balanced) or single-ended (unbalanced) π network. The π network includes one or more series elements each connected in series between the signal input and the signal output and including at least one respective series transistor; and a plurality of shunt elements each including at least one respective shunt transistor. The input stage includes a first right-handed transmission line component and is coupled between the signal input and a first one of the controllable stages. The output stage includes a second right-handed transmission line component and is coupled between the last controllable stage and the signal output. Each intermediate stage includes further respective right-handed transmission line components and is coupled between successive ones of the controllable stages. In some embodiments, a plurality of shunt inductors are included and located at inputs and outputs of each of the two or more controllable stages. The shunt inductors can be used in biasing preceding stages. Alternatively, the shunt inductors may be omitted.

In some embodiments, some or all of the respective series transistors are provided without an inductor in parallel with that series transistor. More generally, in some embodiments, the variable loss attenuator is constructed without an (LC) resonant circuit incorporating with the series transistors, thus improving the attenuator's bandwidth.

In various embodiments, the inherent parasitic capacitances of the series transistors are absorbed into the other components of the apparatus, for example the intermediate stages of the apparatus, and more particularly the transmission lines thereof or the lumped elements operating as a transmission line. That is, the other components of the apparatus (which are in series with the series transistors) can be configured to have series capacitances that are reduced by an amount equal to the parasitic capacitance, so that the total series capacitance of the other components plus the series transistors is substantially equal to a predetermined design capacitance. The combination of intermediate stage and shunt inductors can be sized so that the series parasitic capacitance is absorbed into the left-handed portion of the transmission line.

In some embodiments, the apparatus is configured and controlled so that, to as a controllable amount of input signal attenuation progressively increases, the apparatus acts progressively more as a composite right-handed, lossy left-handed transmission line, and as the controllable amount of input signal attenuation progressively decreases, the apparatus acts progressively more as a right-handed transmission line with shunt parallel LC resonance. The right-handed transmission line may be a low-loss (e.g. very low-loss)

transmission line. The apparatus may further include a control circuit configured to cause the apparatus to operate as described above.

In some embodiments, when the amount of input signal attenuation is low, the parasitic capacitance of the series transistors is bypassed by configuring the series transistors to operate substantially as resistors with relatively low resistance, or very low resistance, e.g. less than 1Ω. This mitigates the effect of the parasitic capacitance of the series transistors. Also, as the amount of input signal attenuation increases, the influence of the series transistor parasitic capacitance increases, but the shunt transistors operate progressively more as shunt resistances. When taken in cooperation with shunt inductors, a portion of the circuit which includes the series transistors acts progressively more as a lossy left-handed transmission line as the amount of signal attenuation increases. This lossy left-handed transmission line cooperates with adjacent intermediate stages to provide a circuit acting as a composite right-handed left-handed transmission line. Furthermore, the action of the shunt transistors as resistors can also mitigate effects of the series transistor parasitic capacitance, because of the lossy behaviour of the apparatus in this configuration.

Accordingly, in various embodiments, the variable loss attenuator is configured and controlled to attenuate an input signal by a controllable amount. As the controllable amount of attenuation progressively increases, the apparatus (with shunt inductors included) acts progressively more as a composite right-handed, left-handed transmission line comprising a left-handed transmission line portion having series capacitance and shunt inductance. Moreover, the series capacitance is provided using parasitic capacitance of the at least one respective transistor.

In some embodiments, the more lossy the left-handed transmission line, the lower the output signal level and the wider the attenuation range. (The shunt transistor minimum resistance may be fixed, e.g. at 50Ω for matching and attenuation purposes.) As such, a lossy left-handed transmission line is desirable for maximum attenuation. In some embodiments, because of the circuit configuration in combination with transistors sizes (in particular with the shunt transistors being smaller than the series transistors), the circuit is well-matched across the bandwidth and for a large attenuation range. For example, in an idealized case, in a maximum gain configuration, the series transistors can present practically zero resistance and the shunt transistors can present a practically infinite resistance, which results in a well-matched circuit. In another idealized case, in a maximum loss configuration, the series transistors can present a practically infinite resistance and the shunt transistors can present a resistance of 50Ω, which again results in a well-matched circuit.

In accordance with another embodiment of the present invention, there is provided a method for operating the apparatus as described above. The method includes obtaining a desired signal level to be provided by the variable loss attenuator. The method further includes controlling the series transistors and the shunt transistors of the attenuator apparatus to implement the desired signal level. Controlling the series transistors may include adjusting the gate voltage of the series transistors toward an ON condition and adjusting the gate voltage of the shunt transistors toward an OFF condition as the desired signal level (e.g. signal power) increases toward a minimum loss in this configuration. Controlling the series transistors may similarly include adjusting the gate voltage of the series transistors toward the OFF condition and adjusting the gate voltage of the shunt transistors toward the ON condition as the desired signal level decreases toward a maximum loss in this configuration.

BRIEF DESCRIPTION OF THE FIGURES

Further features and advantages of the present invention will become apparent from the following detailed description, taken in combination with the appended drawings, in which:

FIG. 10A illustrates a FET having a gate G, a source S and a drain D.

FIG. 10B illustrates an equivalent circuit model for FIG. 10A at (e.g. radio) communication frequencies and for certain FET operating conditions.

FIG. 10C illustrates the equivalent circuit model for FIG. 10B when the FET is ON.

FIG. 10D illustrates the equivalent circuit model for FIG. 10B when the FET is OFF.

FIG. 13A illustrates an equivalent circuit representation of FIGS. 4 to 6, when the attenuator apparatus is operated in a maximum gain (minimum loss) configuration.

FIG. 13B illustrates an equivalent circuit representation of FIGS. 4 to 6, when the attenuator apparatus is operated in a minimum gain (maximum loss) configuration.

It will be noted that throughout the appended drawings, like features are identified by like reference numerals.

DETAILED DESCRIPTION

Embodiments of the present invention provide for a variable loss attenuator which may be used, for example in a transmitter or receiver circuit, to reduce signal amplitude by a controllable amount. The attenuator includes a signal input for receiving a signal to be attenuated, a signal output for providing the attenuated signal, and multiple controllable stages operate together to attenuate the signal by a controlled amount. Transmission line sections connect the controllable stages to each other and to the signal input and output. Each controllable stage is described as a π network which includes controlled transistors that can be modeled, for relevant signal frequencies, as controllable varistors having parasitic capacitance. The transistors may be field-effect transistors (FETs), such as Metal Oxide Semiconductor FETs (MOS-FETs), N-Channel FETs (NFETs), P-Channel FETs (PFETs), or other types of transistor such as Heterojunction Bipolar Transistors (HBTs), High Electron Mobility Transistors (HEMTs), or a combination thereof. The transistors may have one or multiple fingers, and different transistors may be designed with different numbers of fingers. Use of multiple fingers may mitigate transistor parasitic resistances. The attenuator is described primarily herein in a differential (balanced) configuration. However, in other embodiments, the attenuator can be provided in a single-ended (unbalanced) configuration, which is also described.

Figure 2:
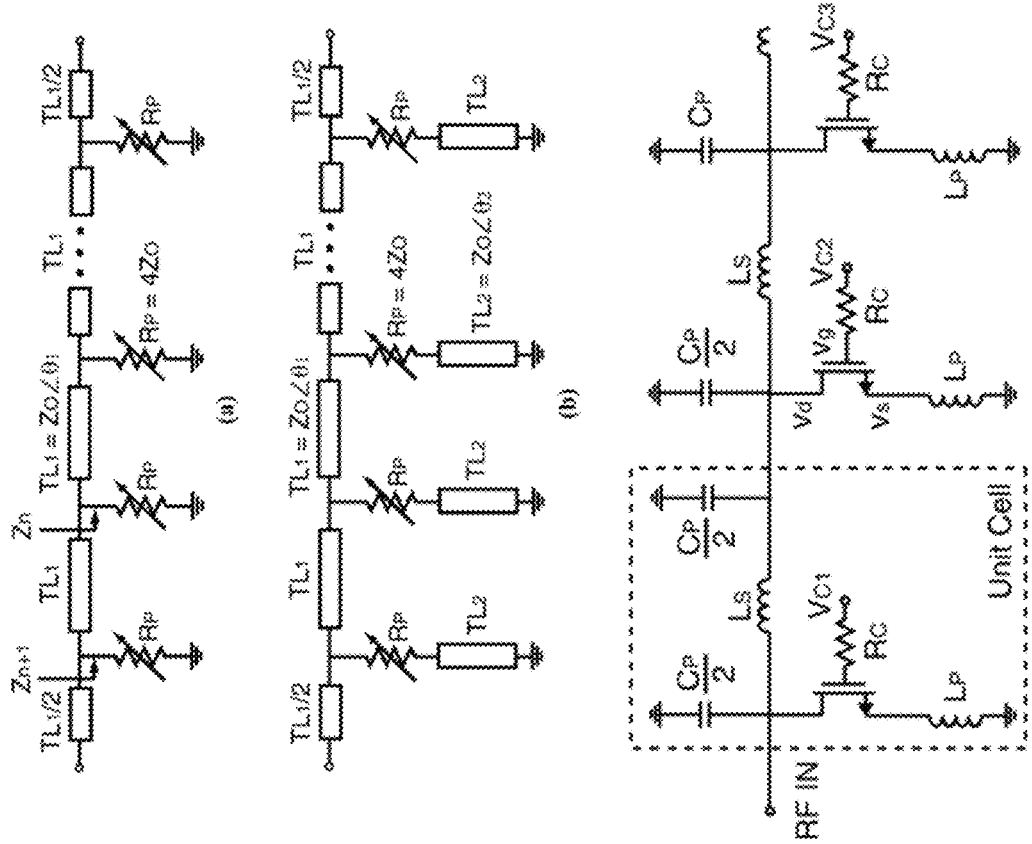
FIG. 2 illustrates a distributed step attenuator, in accordance with the prior art.

It is recognized herein that adding one or more variable-impedance series elements (such as transistors operating as varistors) into the structure of FIG. 2 could, in principle, improve the operating characteristics of the distributed attenuator. As the impedance of the existing shunt attenuating elements is decreased, the impedance of the series elements could be increased in order to maintain a more stable overall input and output impedance, for example in order to provide for substantially constant input and output matching. However, adding such series elements typically also results in addition of a series parasitic capacitance, which tends to impair the broadband response of the variable attenuator since it is not typically possible to compensate or absorb the series capacitance into a right-handed transmission line as shown in FIG. 2.

Embodiments of the present invention provide for a way to introduce and utilize such a series element in a manner that mitigates or avoids such impairment of the broadband attenuator response. As such, series varistors, e.g. in the form of FETs or other transistor types and having an inherent capacitance, are utilized in a distributed attenuator circuit while substantially maintaining broadband operating characteristics.

Embodiments of the present invention utilize a composite right-hand left-hand transmission line to absorb both the series and shunt parasitic elements of a π attenuator. The π attenuator has a variable gain due to the use of controllable transistors, and includes both series and shunt transistor elements. This potentially allows for an improvement in attenuator bandwidth characteristics along with a desirable attenuation range. In fact, embodiments of the present invention can be configured to provide a large attenuation range due to its general design, and the design and sizing of its components such as transistors. In contrast with conventional approaches, a distributed circuit is made to incorporate and handle a series capacitive component. In some embodiments, the shunt transistors are significantly smaller (e.g. at least 4 times smaller) than the series transistors. The parasitic capacitance of the shunt transistors is therefore correspondingly smaller than the parasitic capacitance of the series transistors.

Having reference again to FIG. 1, it is noted that if the 250 pH series inductors were simply removed, there would still remain series parasitic capacitances in the series transistors (which are connected in parallel with the 250 pH series inductors). This series parasitic capacitance can cause issues with bandwidth, accuracy and attenuation range. Furthermore, this series parasitic capacitance cannot be readily absorbed with another component of FIG. 1 to mitigate these issues. This issue is addressed by embodiments of the present invention. In particular, the present invention utilizes a composite right-handed-left-handed transmission line which incorporates the series parasitic capacitances as part of a left-handed transmission line. Thus, the series parasitic capacitance, which is difficult to absorb or omit, is instead made use of in the attenuator circuit. Use of the composite right-handed-left-handed transmission line may lead to a wide bandwidth response and large attenuation range of the attenuator. Accordingly, embodiments of the present invention allow for omission of the series inductors such as those shown in FIG. 1. It is also noted that the circuit illustrated in FIG. 2 does not employ a series transistor (with attendant series parasitic capacitance), possibly due to the issues with such parasitic capacitance as identified above. The circuit of FIG. 2 may suffer from a poor return loss and lack of adequate impedance matching across its attenuation range.

Figures 3A, 3B:
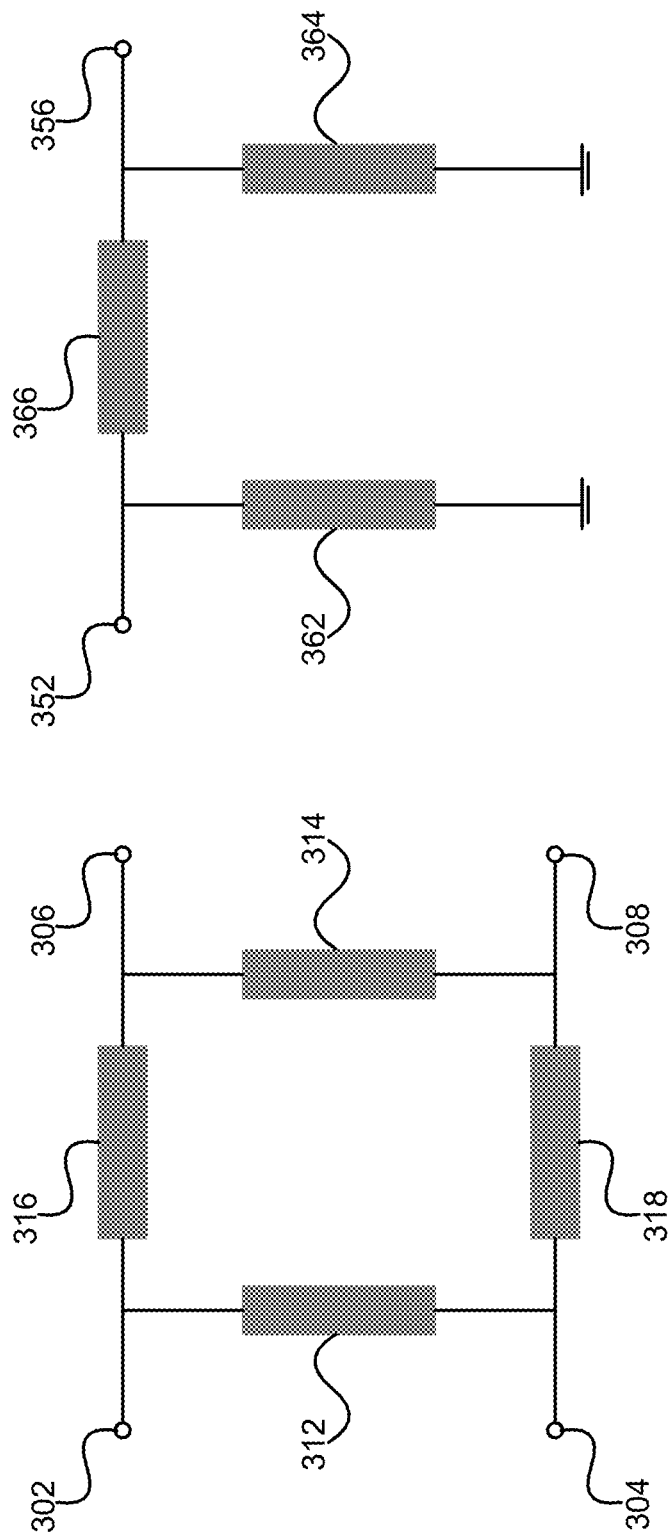
FIG. 3A illustrates a general differential (balanced) π network usable in an attenuator, in accordance with the prior art and embodiments of the present invention.
FIG. 3B illustrates a general single-ended (unbalanced) π network usable in an attenuator, in accordance with the prior art and embodiments of the present invention.

As used herein, the term "π network" (also known as a π pad) refers to an electrical circuit of the form shown in FIG. 3A or FIG. 3B. Certain forms of such circuits, for example in which the series and shunt elements are fixed resistors, are commonly known in the literature. FIG. 3A illustrates a differential π network for use with differential transmission lines. An input voltage is applied across the input terminals 302, 304 to result in an output voltage across the output terminals 306, 308. Shunt elements 312 and 314 are connected across the input terminals and output terminals, respectively. That is, a first terminal of element 312 is connected to the first input terminal 302, a second terminal of element 312 is connected to the second input terminal 304, a first terminal of element 314 is connected to the first output terminal 306, and a second terminal of element 314 is connected to the second output terminal 308. Series elements 316 and 318 are connected between the input terminals and output terminals. That is, a first terminal of element 316 is connected to the first input terminal 302, a second terminal of element 316 is connected to the first output terminal 306, a first terminal of element 318 is connected to the second input terminal 304, and a second terminal of element 318 is connected to the second output terminal 308. Elements 312, 314, 316, 318 may each be single components or pluralities of components and are designed or operated to present a desired impedance within the π network circuit. In contrast with traditional π network which include fixed impedance elements, embodiments of the present invention employ variable impedance elements such as varistors (e.g. using transistors).

FIG. 3B illustrates a single-ended π network for use with single-ended transmission lines. The term "ground" refers to a nominal reference level. An input voltage, relative to ground is applied at the input terminal 352, to result in an output voltage (relative to ground) at the output terminal 356. Shunt elements 362 and 364 are connected between ground and the input terminal and output terminal, respectively. That is, a first terminal of element 362 is connected to the input terminal 352, a second terminal of element 362 is connected to ground, a first terminal of element 364 is connected to the output terminal 356, and a second terminal of element 364 is connected to ground. Series element 366 is connected between the input terminal and the output terminal. That is, a first terminal of element 366 is connected to the input terminal 352, and a second terminal of element 366 is connected to the output terminal 356. Elements 362, 364, 366 may each be single components or pluralities of components and are designed or operated to present a desired impedance within the π network circuit.

Figure 4:
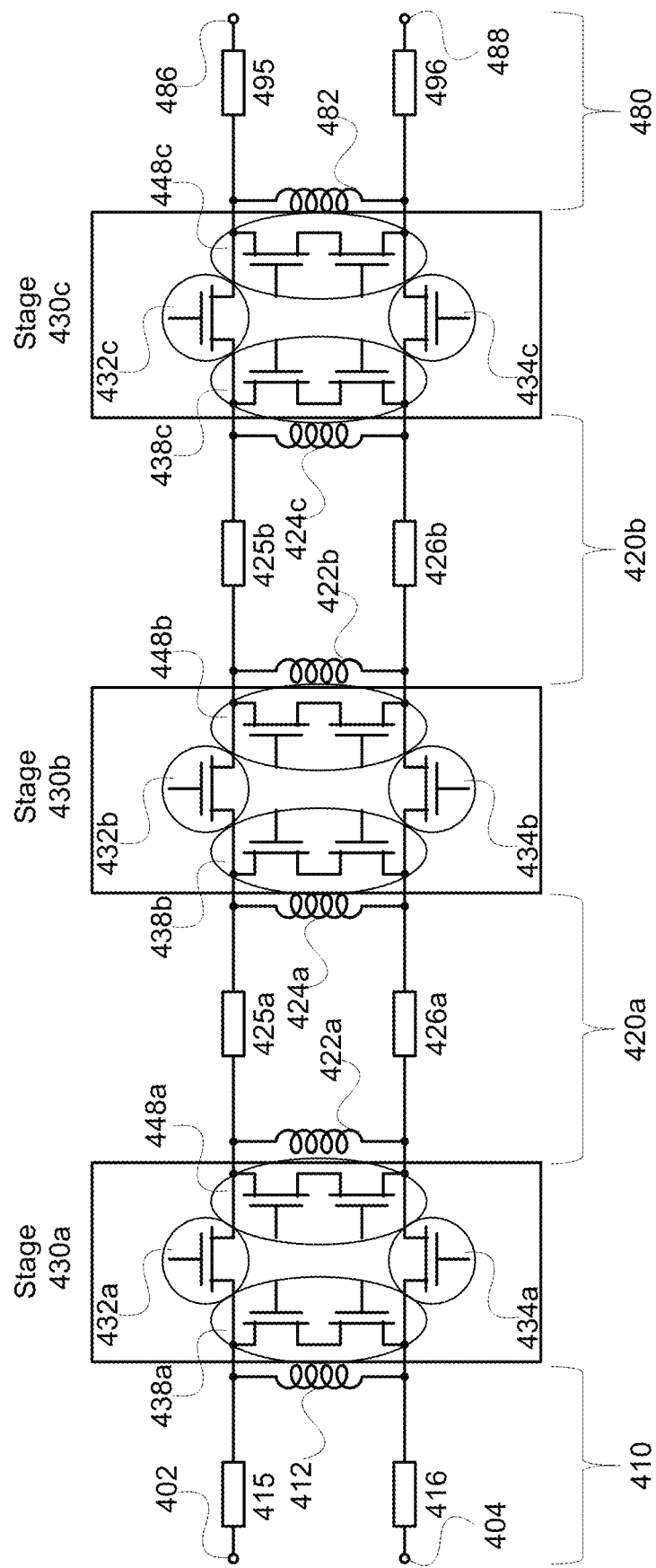
FIG. 4 illustrates a differential (balanced) variable loss attenuator according to an embodiment of the present invention.

FIG. 4 illustrates a variable loss attenuator according to an embodiment of the present invention. The illustrated apparatus is in a differential (balanced) configuration and includes a signal input having two terminals 402, 404, for receiving a signal to be attenuated as a differential time-varying input voltage, and a signal output having two terminals 486, 488 for providing the attenuated signal as a differential time-varying output voltage. The apparatus further includes three controllable stages 430a, 430b, 430c. However, it should be noted that other embodiments may have two controllable stages, or four or more controllable stages. For example, in a two-stage embodiment, the third controllable stage 430c and the second intermediate stage 420b may be omitted, and output of the second controllable stage 430b can be connected directly to the output stage 480.

An input stage 410 is coupled between the signal input and the first controllable stage 430a. An output stage 480 is coupled between the last controllable stage 430c and the signal output. A first intermediate stage 420a is coupled between the first controllable stage 430a and the second controllable stage 430b. A second intermediate stage 420b is coupled between the second controllable stage 430b and the third controllable stage 430c. If only two controllable stages are provided, the second intermediate stage is omitted. If four or more controllable stages are provided, additional intermediate stages will be provided, such that each pair of successive controllable stages is coupled together via a different intermediate stage.

The input stage 410, output stage 480, and each intermediate stage (including first and second intermediate stages 420a, 420b) each include a respective right-handed transmission line. The transmission lines of the various stages are schematically represented by elements 415, 416, 425a, 426a, 425b, 426b, 495 and 496. As will be readily understood by a person with general knowledge in the field, a right-handed transmission line comprises series inductance and shunt capacitance. In the present embodiment, the transmission line is a differential line. The transmission line may be constructed based on different topologies, such as a pair of parallel line conductors, a coaxial cable, a stripline, a microstrip, or a coplanar waveguide, from which the series inductance and shunt capacitance are due to the inherent properties of the transmission line. The transmission line component may additionally or alternatively include discrete (e.g. lumped) elements such as series inductors and shunt capacitors, or physical features providing for discrete or distributed series inductance or shunt capacitance. The impedance of the transmission line can be configured to have desired characteristic impedance, for example by physical design thereof as would be readily understood by a person with general knowledge in the field.

The impedance of the transmission line may be configured in order to compensate for the impedance of adjacent controllable stages. For example, absorbing a given capacitance (or other given impedance) into a transmission line can refer to the design act of reducing the capacitance (or other impedance) of the transmission line by the amount of the given capacitance (or other given impedance). As such, the capacitance (or other impedance) of the transmission line plus the given capacitance (or other given impedance) together provide a total "design" capacitance (or impedance). It is noted that the capacitance/impedance of a transmission line can be adjusted by adjusting its length, by adjusting its characteristic impedance, or a combination thereof.

The apparatus further includes a plurality of shunt inductors 412, 422a, 424a, 422b, 424b, 482 located at inputs, outputs, or both inputs and outputs of each of the two or more controllable stages 430a, 430b, 430c. As illustrated, the shunt inductors are nominally included in the input stage 410, output stage 480, and intermediate stages 420a, 420b. However, if the shunt inductors are provided as discrete components, they can equivalently be regarded as components of the controllable stages 430a, 430b, 430c. For example, the shunt inductors can be viewed as respective elements of the plurality of shunt elements of the controllable stages, as will be described below. The shunt inductors can be discrete components or distributed components, or provided as a combination thereof. Shunt inductors can be provided as distributed components by configuring the input stage 410, output stage 480, and intermediate stages 420a, 420b (e.g. configuring transmission lines topologies of these stages) such that the desired amount of shunt inductance arises from the inherent properties (topologies) of these stages. As already mentioned above, configuring transmission lines to have desired characteristic impedance can be performed using distributed elements that would be readily understood by a worker skilled in the art. The shunt inductors can be provided using the transmission lines of the intermediate stages (where provided), or using separate transmission line portions or other structures coupled to the intermediate stages.

The controllable stages 430a, 430b, 430c are each configured as a differential π network, respectively including two series elements 432a, 434a, 432b, 434b, 432c, 434c, and two shunt elements 438a, 448a, 438b, 448b, 438c, 448c. The series elements 432a, 434a, 432b, 434b, 432c, 434c are each ultimately connected in series between the signal input and signal output. More particularly, the series elements 432a, 432b, 432c are connected in series between the positive node of input terminal 402 and the positive node of output terminal 486, while the series elements 434a, 434b, 434c are connected in series between the negative node of input terminal 404 and the negative node of output terminal 488. The two series elements of each controllable stage are therefore located on opposing lines between the positive node of input signal and the positive node of output signal, and negative node of input signal and negative node of output signal. The opposing lines are positive and negative lines, where the positive (respectively negative) line connects the positive node (respectively negative) of the input terminal to the positive node (respectively negative) of the output terminal. In other words, a first one of the lines includes all of the elements connected in series between the input terminal 402 and the output terminal 486, and a second one of the lines includes all of the elements connected in series between the input terminal 404 and the output terminal 488.

Each of the series elements 432a, 434a, 432b, 434b, 432c, 434c includes a respective series transistor (e.g. MOSFET). In at least some embodiments, each series element is provided without an inductor in parallel with the respective series transistor. In various embodiments, and as illustrated, each series element can consist or consist essentially of a single transistor. Notably, contrary to the circuit illustrated in FIG. 1, the series elements exclude an inductive element directly coupled to the series transistor and electrically in parallel with the series transistor. Avoiding the use of such an inductor in the series elements mitigates or eliminates the presence of an LC parallel resonant circuit. This in turn reduces the (e.g. RMS) gain and phase error of the attenuator over a wider range and widens the attenuator's bandwidth.

For example, parallel inductive-capacitive (LC) resonant circuits are well known to produce significantly higher attenuation near a resonant frequency and lower attenuation away from the resonant frequency, which would result in a frequency response of the attenuator that varies significantly with frequency. As the transistors include a parasitic capacitance, use of an inductor in parallel with a transistor (mainly within the series elements which may be relatively large in size) can potentially result in such a resonant circuit. By limiting or avoiding such a parallel inductance in the series elements, variation in frequency response is mitigated.

It is noted that parallel LC circuits can still be present in the shunt elements. However, in this case, the shunt capacitors can be configured to be small and possibly negligible, so that the overall circuit bandwidth is not significantly narrowed by the resonance. The shunt inductors are not necessarily sized to provide an LC resonance circuit. Rather, they are included in order to provide a left-handed transmission line part of the attenuator.

Each of the shunt elements 438a, 448a, 438b, 448b, 438c, 448c includes a pair of shunt transistors (e.g. MOSFETs) connected together (Drain to Source) with a (e.g. virtual) ground connection therebetween. In various embodiments, and as illustrated, each shunt element can consist or consist essentially of two transistors. The connection point between the two transistors may be a virtual ground, used to facilitate control and operation of the transistors in the differential (balanced) configuration. It is possible to regard each of the shunt inductors 412, 422a, 424a, 422b, 424b, 482 as components of one of the shunt elements 438a, 448a, 438b, 448b, 438c, 448c directly coupled thereto, in which case each shunt element can comprise a pair of transistors (connected Drain to Source) in parallel with a shunt inductor. Some or all of the shunt inductors may be separated into two inductors, optionally with a tap terminal there between. Alternatively, each shunt transistor can be provided in parallel with a separate corresponding shunt inductance which is directly electrically connected between the shunt transistor's source and drain terminals.

Figure 5:
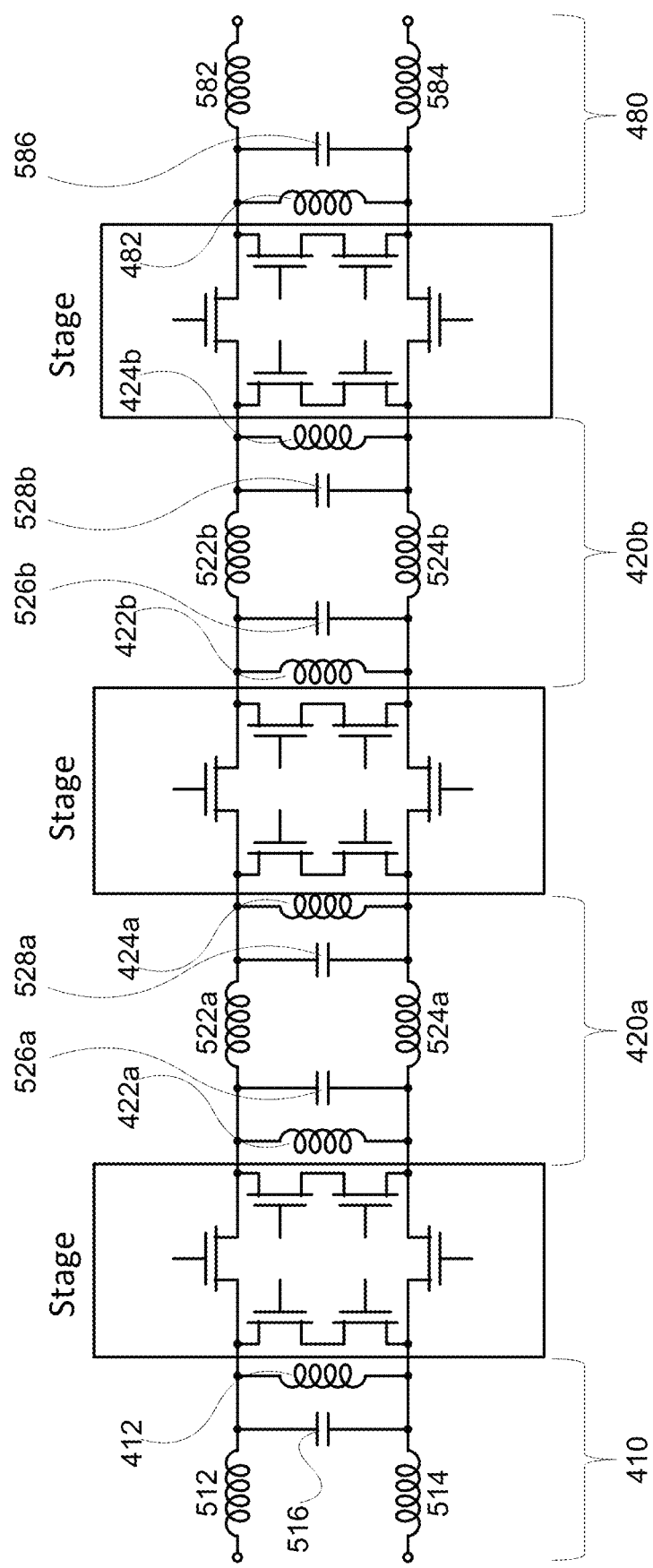
FIG. 5 illustrates a differential variable loss attenuator according to an embodiment of the present invention, in which transmission line impedance elements are explicitly shown.

FIG. 5 illustrates a variable loss attenuator according to an embodiment of the present invention. The apparatus of FIG. 5 is similar to that of FIG. 4, except that in FIG. 5 the series inductances and shunt capacitances of the input stage 410, output stage 480, and intermediate stages 420a, 420b (e.g. of the right-handed transmission lines thereof) are explicitly shown. FIG. 5 can therefore be regarded as an equivalent circuit representation of FIG. 4. FIG. 5 can also be regarded as an embodiment in which distributed transmission lines are replaced or supplemented with series inductors and shunt capacitors (as well as shunt inductors) provided as lumped components, e.g. provided as discrete elements or distributed elements of a circuit topology. That is, the transmission lines can be constructed using lumped components.

In more detail, the input stage 410 of FIG. 5 includes series inductances 512, 514 and shunt capacitance 516. The first intermediate stage 420a includes series inductances 522a, 524a and shunt capacitances 526a, 528a. The second intermediate stage 420b includes series inductances 522b, 524b and shunt capacitances 526b, 528b. The output stage 480 of FIG. 5 includes series inductances 582, 584 and shunt capacitance 586.

Figure 6:
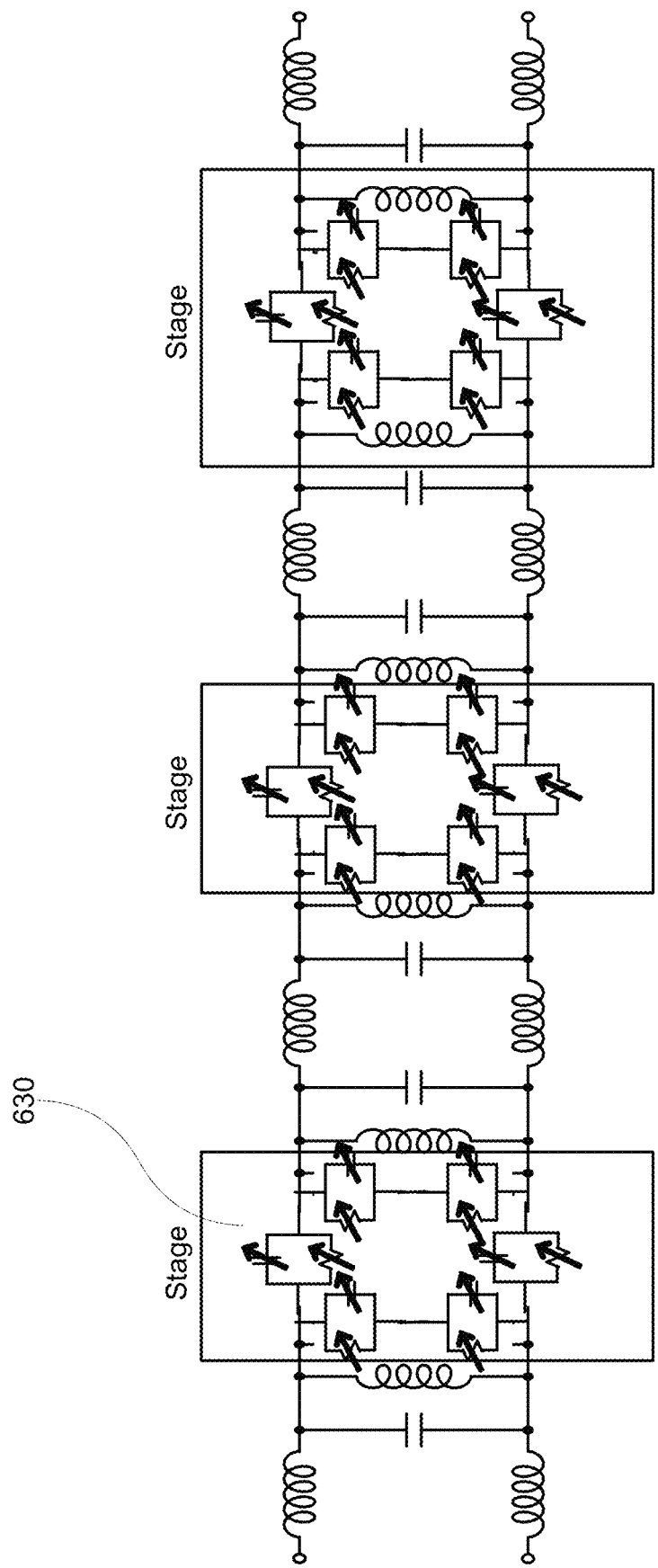
FIG. 6 illustrates an equivalent circuit of the variable loss attenuator shown in FIG. 4 and FIG. 5, according to an embodiment of the present invention.

FIG. 6 illustrates an equivalent circuit representation, at relevant communication signal (e.g. radio or millimeter-wave frequencies) frequencies, of the variable loss (RF) attenuator of FIGS. 4 and 5, according to an embodiment of the present invention. In FIG. 6, the transistors of the series elements 432a, 434a, 432b, 434b, 432c, 434c and shunt elements 438a, 448a, 438b, 448b, 438c, 448c are represented using parallel RC circuits (e.g. 630), with variable resistance and capacitance in parallel with one another. Details of this aspect of the equivalent circuit representation are provided with respect to FIGS. 10A to 10D.

Figure 7:
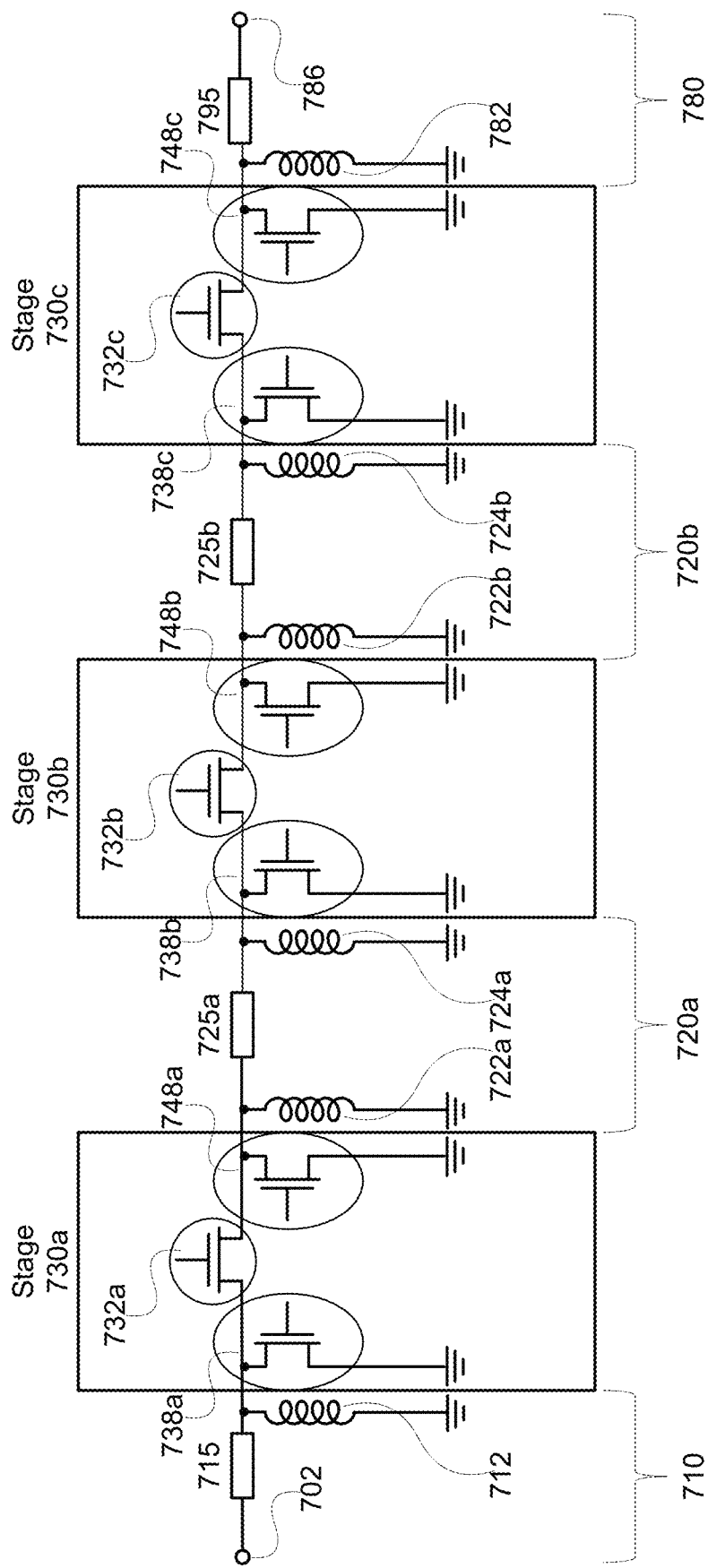
FIG. 7 illustrates a single-ended (unbalanced) variable loss attenuator according to an embodiment of the present invention.

FIG. 7 illustrates a variable loss attenuator according to another embodiment of the present invention. The illustrated apparatus is in a single-ended (unbalanced) configuration and includes a signal input having terminal 702, for receiving a signal to be attenuated as a time-varying input voltage (relative to ground), and a signal output having a terminal 786 for providing the attenuated signal as a time-varying output voltage (relative to ground). The apparatus further includes three controllable stages 730a, 730b, 730c. However, it should be noted that other embodiments may have two controllable stages, or four or more controllable stages. The apparatus of FIG. 7 operates similarly to the apparatus of FIG. 4, but in a single-ended mode. The apparatus of FIG. 4 can be constructed using two opposing halves, each half being essentially the apparatus of FIG. 7.

An input stage 710 is coupled between the signal input and the first controllable stage 730a. An output stage 780 is coupled between the last controllable stage 730c and the signal output. A first intermediate stage 720a is coupled between the first controllable stage 730a and the second controllable stage 730b. A second intermediate stage 720b is coupled between the second controllable stage 730b and the third controllable stage 730c. If only two controllable stages are provided, the second intermediate stage is omitted. If four or more controllable stages are provided, additional intermediate stages will be provided, such that each pair of successive controllable stages is coupled together via a different intermediate stage.

The input stage 710, output stage 780, and each intermediate stage (including first and second intermediate stages 720a, 720b) each include a respective right-handed transmission line component, comprising series inductance and shunt capacitance. In the present embodiment, the transmission line component is a single-ended (unbalanced) transmission line component. The transmission line component may be a physical (unbalanced) transmission line, with the series inductance and shunt capacitance due to the inherent properties of the transmission line. The transmission line component may additionally or alternatively include discrete impedance elements such as series inductors and shunt capacitors, or physical features providing for discrete or distributed series inductance or shunt capacitance. The impedance of the transmission line component can be configured to have desired characteristics. The impedance of the transmission line component may be configured in order to compensate for the impedance of adjacent controllable stages.

The apparatus further includes a plurality of shunt inductors 712, 722a, 724a, 722b, 724b, 782 located at inputs, outputs, or both inputs and outputs of each of the two or more controllable stages 730a, 730b, 730c. The shunt inductors are connected between the signal line and ground. As illustrated, the shunt inductors are nominally included in the input stage 710, output stage 780, and intermediate stages 720a, 720b. However, if the shunt inductors are provided as discrete components, they can equivalently be regarded as components of the controllable stages 730a, 730b, 730c. The shunt inductors can be discrete components or distributed components. Shunt inductors can be provided as distributed components by configuring the input stage 710, output stage 780, and intermediate stages 720a, 720b such that the desired amount of shunt inductance arises from the inherent properties (topologies) of these stages.

The controllable stages 730a, 730b, 730c are each configured as a single-ended (unbalanced) π network, respectively including one series element 732a, 732b, 732c, and two shunt elements 738a, 748a, 738b, 748b, 738c, 748c. The series elements 732a, 732b, 732c are each ultimately connected in series between the signal input and signal output. More particularly, the series elements 732a, 732b, 732c are connected in series between the input terminal 402 and the output terminal 486.

Each of the series elements 732a, 732b, 732c includes a respective series transistor (e.g. MOSFET) without an inductor in parallel with the respective series transistor. In various embodiments, and as illustrated, each series element can consist or consist essentially of a single transistor, possibly with multiple fingers. In contrast with FIG. 1, the series elements do not include inductors in parallel with the series transistors.

Each of the shunt elements 738a, 748a, 738b, 748b, 738c, 748c includes a shunt transistor (e.g. MOSFET) connected between the signal line and ground. In various embodiments, and as illustrated, each shunt element can consist or consist essentially of a single transistor. It is possible to regard each of the shunt inductors 712, 722a, 724a, 722b, 724b, 782 as components of one of the shunt elements 738a, 748a, 738b, 748b, 738c, 748c directly coupled thereto, in which case each shunt element can comprise a transistor in parallel with a shunt inductor.

Figure 8:
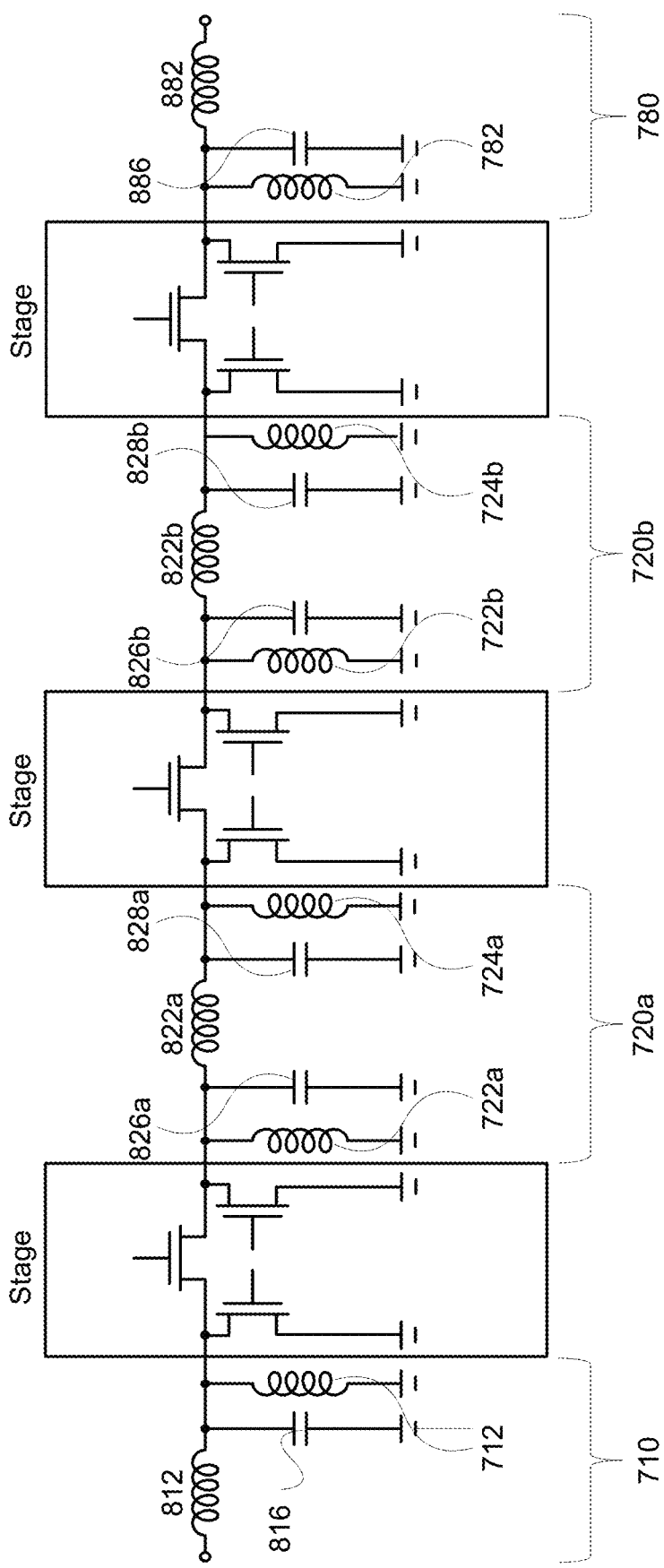
FIG. 8 illustrates a single-ended (unbalanced) variable loss attenuator according to an embodiment of the present invention, in which transmission line impedance elements are explicitly shown.

FIG. 8 illustrates a variable loss attenuator according to an embodiment of the present invention. The apparatus of FIG. 8 is similar to that of FIG. 7, except that in FIG. 8 the series inductance and shunt capacitance of the intermediate stages (e.g. of the right-handed transmission lines thereof) are explicitly shown. FIG. 8 can therefore be regarded as an equivalent circuit representation of FIG. 7. FIG. 8 can also be regarded as an embodiment in which physical transmission line components are replaced or supplemented with series inductors and shunt capacitors (as well as shunt inductors), e.g. provided as discrete elements or distributed elements of a circuit topology.

In more detail, the input stage 710 of FIG. 8 includes series inductance 812 and shunt capacitance 816. The first intermediate stage 720a includes series inductance 822a and shunt capacitances 826a, 828a. The second intermediate stage 720b includes series inductance 822b and shunt capacitances 826b, 828b. The output stage 780 includes series inductance 882 and shunt capacitance 886.

Figure 9:
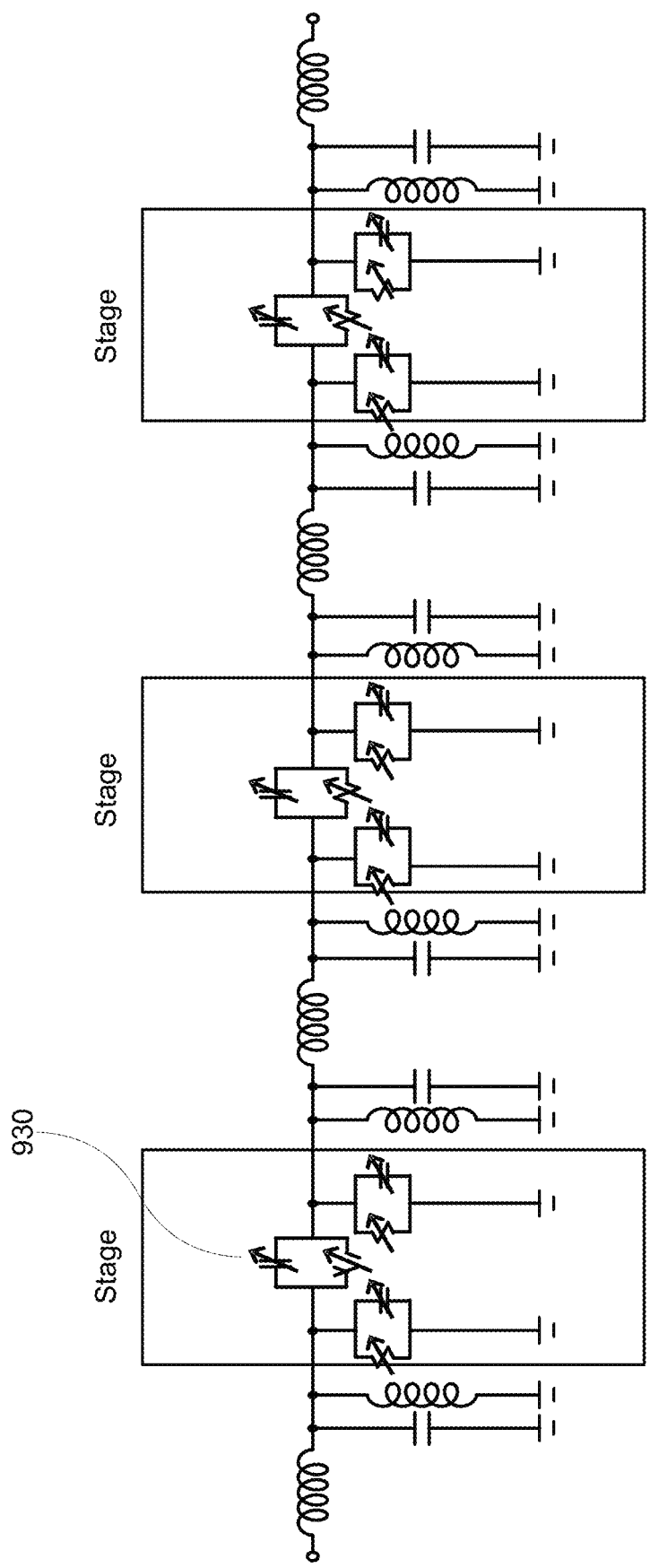
FIG. 9 illustrates an equivalent circuit representation for the variable loss attenuator of FIGS. 7 and 8, according to an embodiment of the present invention.

FIG. 9 illustrates an equivalent circuit representation, at relevant communication signal frequencies, of the variable loss attenuator of FIGS. 7 and 8, according to an embodiment of the present invention. In FIG. 9, the transistors of the series elements 732a, 732b, 732c and shunt elements 738a, 748a, 738b, 748b, 738c, 748c are represented using parallel RC circuits (e.g. 930), with variable resistance and capacitance in parallel with one another. Details of this aspect of the equivalent circuit representation are provided with respect to FIGS. 10A to 10D.

Figures 10A, 10B, 10C, 10D:
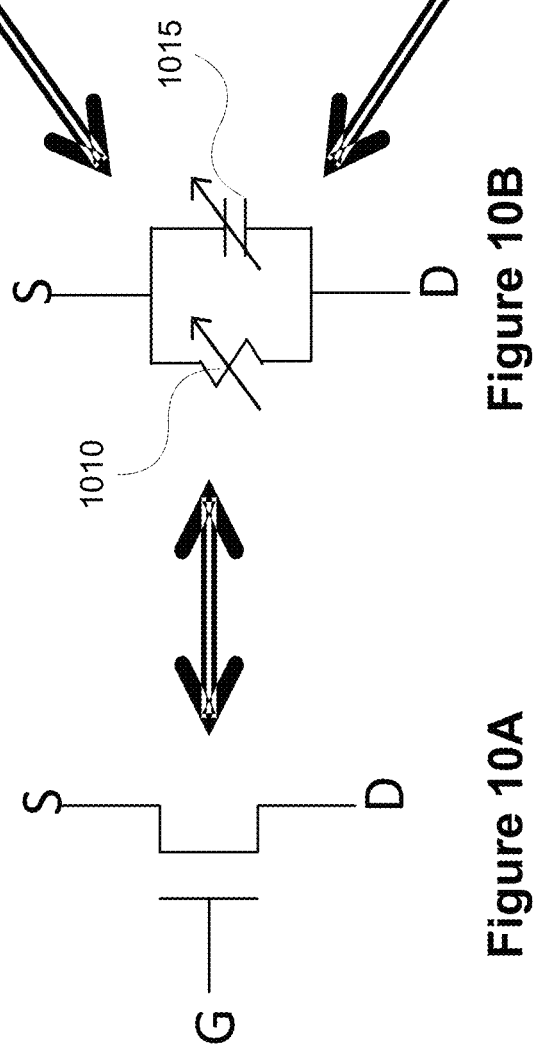

FIGS. 10A to 10D illustrate equivalent circuit models for a transistor (e.g. FET or MOSFET) at communication frequencies. FIG. 10A illustrates the FET transistor having a gate G, a source S and a drain D. FIG. 10B illustrates an equivalent circuit modeled as a variable resistor 1010 in parallel with a variable capacitor 1015, connected between source S and drain D. The resistance and capacitance can be varied by adjusting the transistor gate voltage. The transistor is assumed to be biased into an appropriate operating condition by using a DC control circuit. The FET is biased and operated so that it transitions from the triode (ohmic) region when it is fully ON to the cutoff region when it is fully OFF.

FIG. 10C illustrates the equivalent circuit of FIG. 10B at one extreme operating point, which is referred to as the transistor being fully ON. At this operating point, the equivalent resistance of resistor 1010 is a fixed, typically small, value. The resistance at this operating point can be made small by appropriate design of the transistor. In some embodiments, the transistor can be designed so that the resistance approaches a set minimum value, e.g. approximately zero in the case of a series transistor and 50Ω in the case of a shunt transistor. The parasitic capacitance represented by capacitor 1015 is not shown because it is effectively not present, or minimally present, at this operating point, at least at communication frequencies. The capacitor's minimal presence is due to its impedance being very large relative to the resistance at the operating point.

FIG. 10D illustrates the equivalent circuit of FIG. 10B at another extreme operating point, which is referred to as the transistor being fully OFF. At this operating point, the capacitance represented by capacitor 1015 is a fixed value. The resistance of resistor 1010 is not shown because it is effectively not present, or minimally present, at this operating point, at least at communication frequencies. The resistor's minimal presence is due to it being very large at the operating point.

Figure 11A:
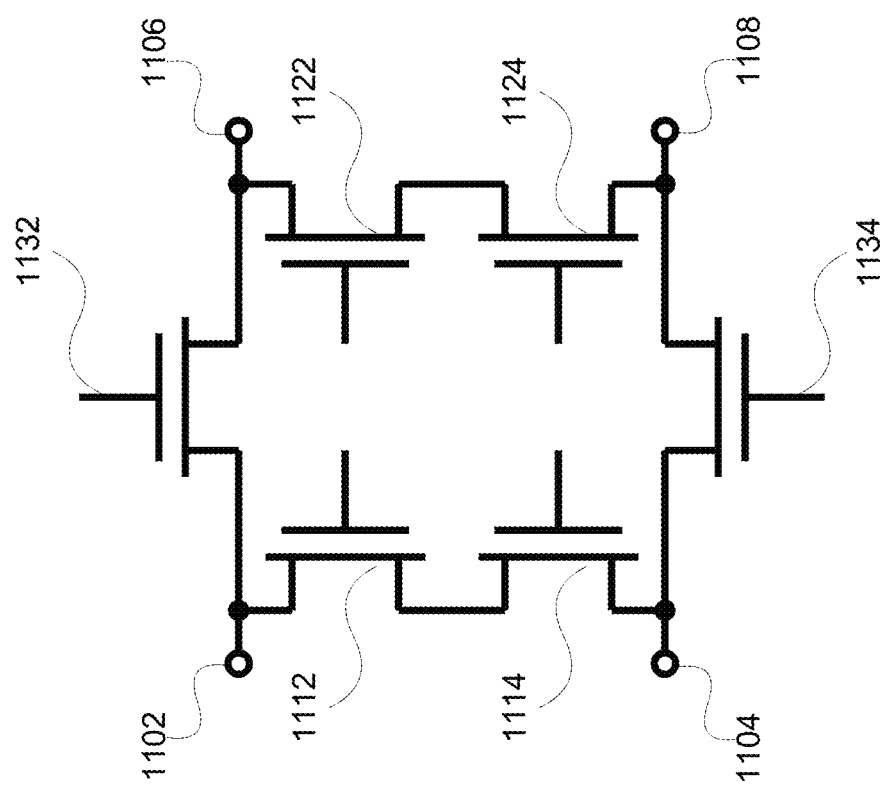
FIG. 11A illustrates a differential π network, according to an embodiment of the present invention.

FIG. 11A illustrates a differential (balanced) π network of transistors, according to an embodiment of the present invention. The illustrated π network can be provided as one of the controllable stages for example as illustrated in FIGS. 4 and 5. The network includes series transistor 1132 coupled in series between a first input terminal 1102 and a first output terminal 1106, series transistor 1134 coupled in series between a second input terminal 1104 and a second output terminal 1108, shunt transistors 1112, 1114 coupled in series with each other between the first input terminal 1102 and the second input terminal 1104, and shunt transistors 1122, 1124 coupled in series with each other between the first output terminal 1106 and the second output terminal 1108.

Figure 11B:
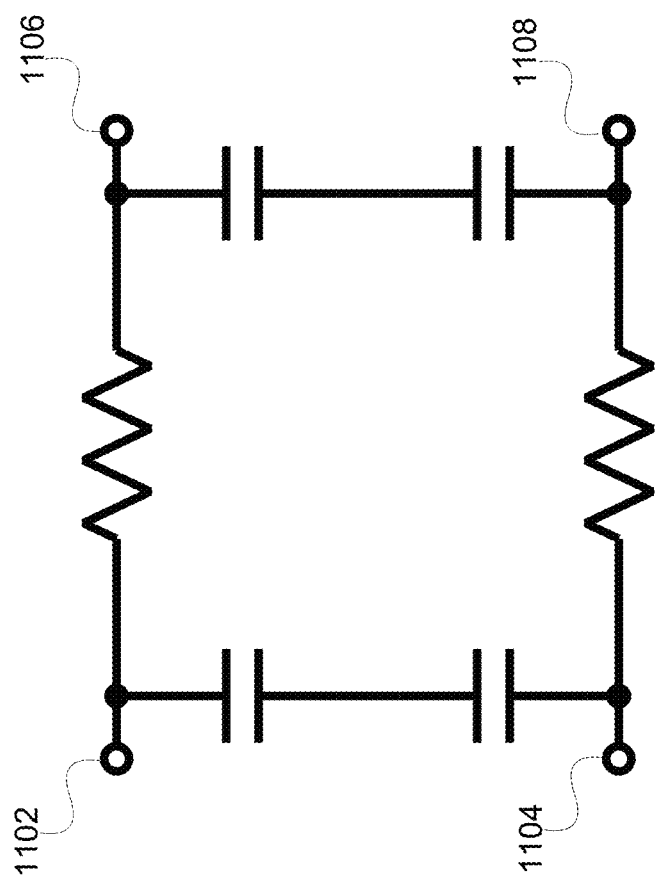
FIG. 11B illustrates an equivalent circuit representation of FIG. 11A when the transistors in the differential π network are controllably operated into a first operating configuration for disposing the variable loss attenuator in a maximum gain (i.e. minimum loss) configuration.

FIG. 11B illustrates an equivalent circuit representation of FIG. 11A when the transistors in the differential (balanced) π network are controllably operated (via control of their gate voltages) into a first operating configuration. In particular, and in view of FIGS. 10A to 10D, the series transistors 1132, 1134 are operated in the ON mode and the shunt transistors 1112, 1114, 1122, 1124 are operated in the OFF mode. This results in the illustrated circuit behaviour with series resistance and shunt capacitance. As will be described below, the first operating configuration can be implemented at each controllable stage to dispose the signal attenuator apparatus in a maximum gain (i.e. minimum loss) configuration.

Figure 11C:
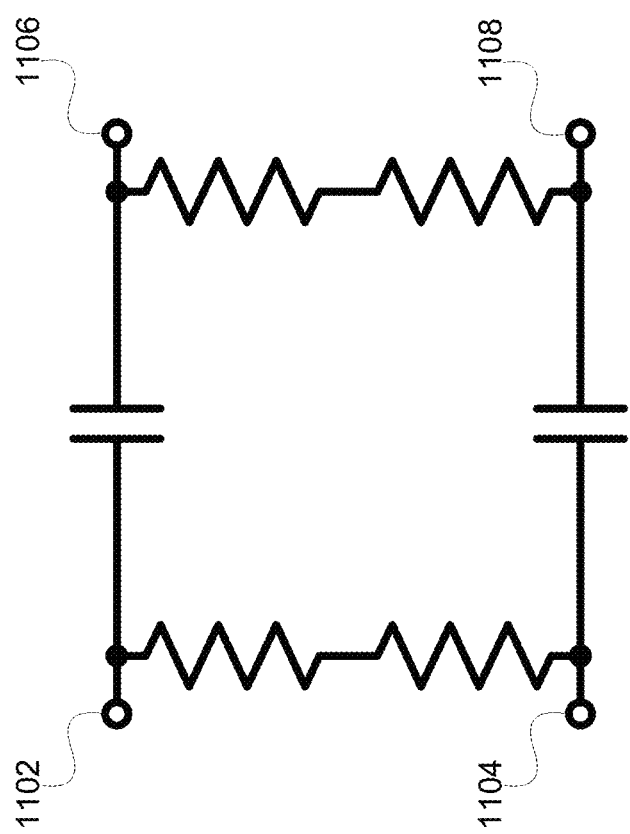
FIG. 11C illustrates an equivalent circuit representation of FIG. 11A when the transistors in the differential π network are controllably operated into a second operating configuration for disposing the variable loss attenuator in a minimum gain (i.e. maximum loss) configuration.

FIG. 11C illustrates an equivalent circuit representation of FIG. 11A when the transistors in the differential (balanced) π network are controllably operated (via control of their gate voltages) into a second operating configuration. In particular, and in view of FIGS. 10A to 10D, the series transistors 1132, 1134 are operated in the OFF mode and the shunt transistors 1112, 1114, 1122, 1124 are operated in the ON mode. This results in the illustrated circuit behaviour with series capacitance and shunt resistance. As will be described below, the second operating configuration can be implemented at each controllable stage to dispose the signal attenuator apparatus in a minimum gain (i.e. maximum loss) configuration.

Figure 11D:
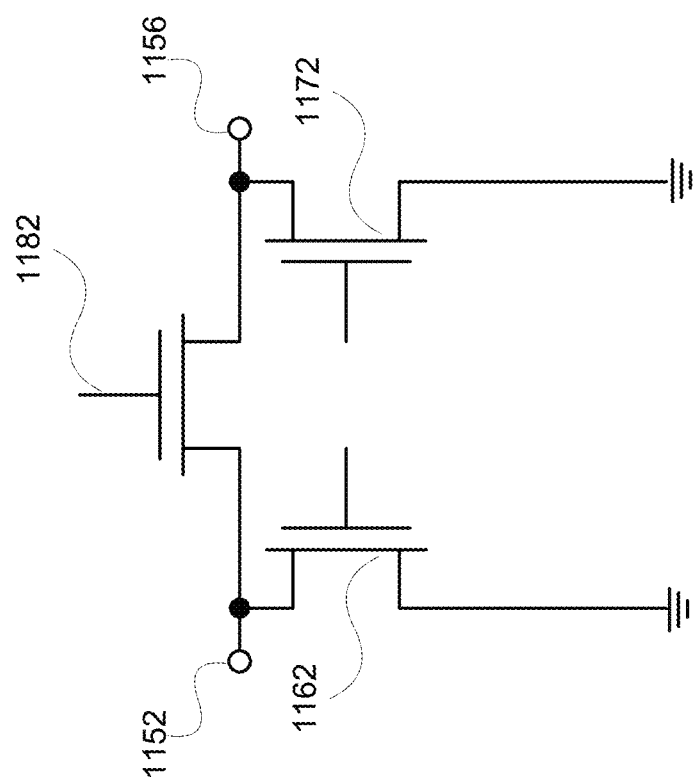
FIG. 11D illustrates a single-ended (unbalanced) π network of transistors, according to an embodiment of the present invention.

FIG. 11D illustrates a single-ended (unbalanced) π network of transistors, according to an embodiment of the present invention. The illustrated π network can be provided as one of the controllable stages for example as illustrated in FIGS. 7 and 8. The network includes series transistor 1182 coupled in series between an input terminal 1152 and an output terminal 1156, shunt transistor 1112 coupled between the first input terminal 1102 and ground, and shunt transistor 1172 coupled between the first output terminal 1156 and ground.

Figure 11E:
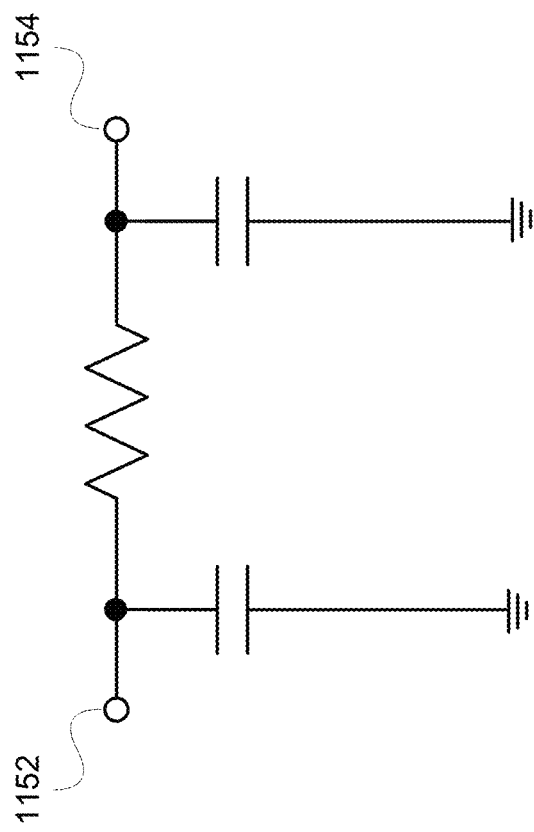
FIG. 11E illustrates an equivalent circuit representation of FIG. 11D when the transistors in the single-ended π network are controllably operated into a first operating configuration for disposing the signal attenuator apparatus in a maximum gain (i.e. minimum loss) configuration.

FIG. 11E illustrates an equivalent circuit representation of FIG. 11D when the transistors in the single-ended (unbalanced) π network are controllably operated into a first operating configuration. In particular, the series transistor 1182 is operated in the ON mode and the shunt transistors 1162, 1172 are operated in the OFF mode. This results in the illustrated circuit behaviour with series resistance and shunt capacitance. The first operating configuration can be implemented at each controllable stage to dispose the signal attenuator apparatus in a maximum gain (i.e. minimum loss) configuration.

Figure 11F:
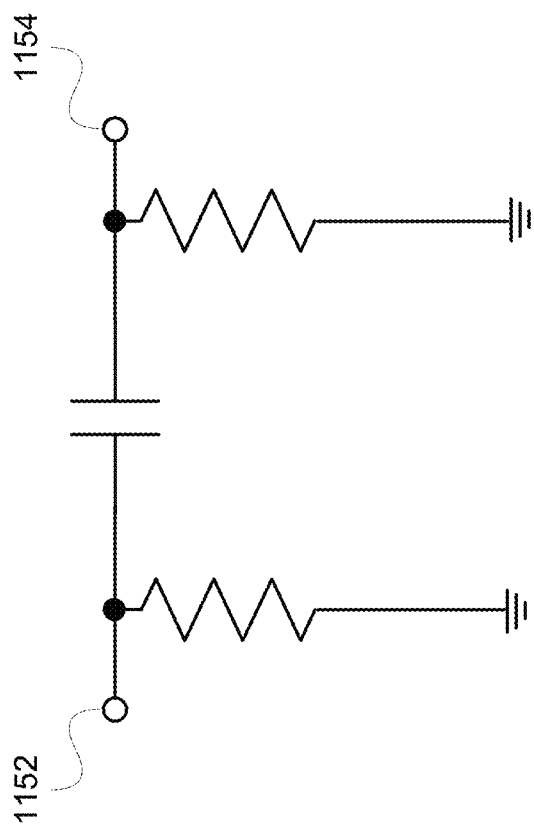
FIG. 11F illustrates an equivalent circuit representation of FIG. 11D when the transistors in the single-ended π network are controllably operated into a second operating configuration for disposing the signal attenuator apparatus in a minimum gain (i.e. maximum loss) configuration.

FIG. 11F illustrates an equivalent circuit representation of FIG. 11D when the transistors in the single-ended (unbalanced) π network are controllably operated into a second operating configuration. In particular, the series transistor 1182 is operated in the OFF mode and the shunt transistors 1162, 1172 are operated in the ON mode. This results in the illustrated circuit behaviour with series capacitance and shunt resistance. The second operating configuration can be implemented at each controllable stage to dispose the signal attenuator apparatus in a minimum gain (i.e. maximum loss) configuration.

Figure 12:
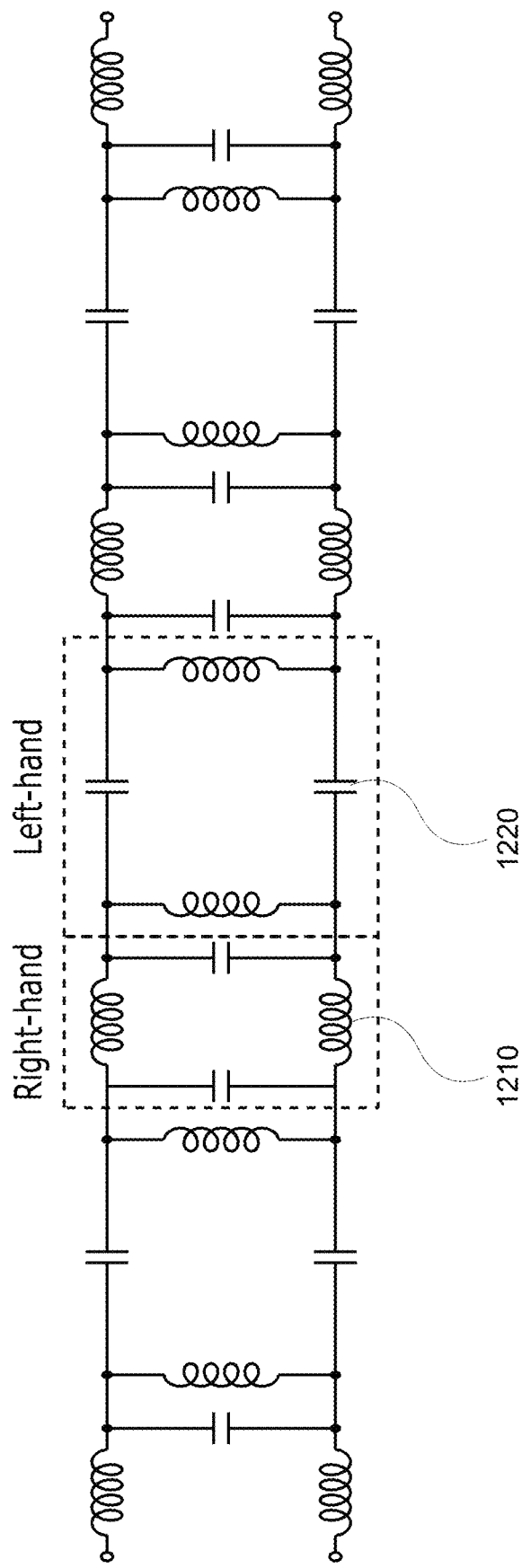
FIG. 12 illustrates, for reference, a composite right-handed left-handed transmission line.

FIG. 12 illustrates, for reference purposes, a composite right-handed left-handed transmission line. The transmission line includes alternating right-handed transmission line portions (e.g. 1210) and left-handed transmission line portions (e.g. 1220). As mentioned above, a right-handed transmission line includes series inductance and shunt capacitance, for example as a cascade of inductances and capacitances. In contrast, as is known in the art, a left-handed transmission line includes series capacitance and shunt inductance, for example as a cascade. Notably, while the right-handed transmission line has a low-pass response, the left-handed transmission line has a high-pass response. A composite right-hand left-hand transmission line can provide a substantially wide bandpass response.

Embodiments of the present invention implement, at least approximately, a lossy version of the composite right-handed left-handed transmission line when operated in the minimum gain (maximum loss) configuration (see e.g. FIG. 13B). The left-handed transmission line can be approximately achieved by using the series transistors acting as capacitors, along with additional shunt inductors. The right-handed transmission line can be approximately achieved by using the shunt transistors acting as capacitors and additional series inductors (e.g. inherent to transmission line sections between controlled stages).

FIG. 13A illustrates an equivalent circuit representation of FIGS. 4 to 6, when the attenuator apparatus is operated in a maximum gain (minimum loss) configuration. In this case, each of the controllable stages are operated in the first operating configuration as illustrated in FIG. 11B. Accordingly, the apparatus effectively includes series elements operating as series resistors 1332a, 1332b, 1332c, 1334a, 1334b, 1334c. These series resistors can be made small (e.g. ideally zero) by configuration of the transistors in the series elements, thus contributing only a limited amount of signal loss. The series resistors are interspersed with circuits (e.g. 1350) which effectively operate as right-handed transmission lines with shunt parallel LC resonant components. Such a transmission line will also operate to pass a signal with limited loss.

The circuit of FIG. 13A works substantially as a right-handed transmission line. The shunt capacitors can be configured to dominate the shunt inductor so that the bandwidth is not narrowed by the resonance. The series transistor acts as a small resistance, which may ideally be set to zero or as close to zero as possible by appropriate sizing of the transistors. As such, the response of the circuit can be made to be similar to a right-handed distributed network.

FIG. 13B illustrates an equivalent circuit representation of FIGS. 4 to 6, when the attenuator apparatus is operated in a minimum gain (maximum loss) configuration. In this case, each of the controllable stages is operated in the second operating configuration as illustrated in FIG. 11C. Accordingly, the apparatus effectively includes series elements operating as series capacitances 1372a, 1372b, 1372c, 1374a, 1374b, 1374c. Notably, the series capacitance, which is an inherent property arising from parasitic capacitance of transistors in the π network circuit, is used to good effect in the apparatus, by acting as a useful series capacitance. The series capacitance is a required component of a left-handed transmission line, which has been purposefully employed.

The circuit of FIG. 13B works similarly to a left-handed transmission line, with the shunt transistors behaving as a lossy conductance in the transmission line comprising the parasitic capacitance of the series transistor and an additional shunt inductor. There is also a right-handed transmission line comprised of either a distributed transmission line, or a line constructed with lumped components such as series inductance and shunt capacitance. In this case, this right-handed transmission line has limited to no real effect.

Furthermore, the apparatus in FIG. 13B effectively includes shunt elements operating as shunt resistors 1360. These shunt resistors can be made small, minimum of 50Ω, by appropriately sizing the shunt transistors. Accordingly, the equivalent circuit comprises components equivalent to alternating right-handed transmission lines (e.g. 1382) and lossy left-handed transmission lines (e.g. 1384). The lossy nature of the left-handed transmission lines is acceptable because the desired configuration is a maximum loss configuration. In principle, the right-handed and left-handed transmission line components substantially cancel out the effects of one another, leading to an improved bandwidth for the apparatus. The right-handed and left-handed transmission lines behave as a high-order bandpass filter in order to carry out this behaviour.

Although not illustrated, the single-ended (unbalanced) attenuator apparatus illustrated in FIG. 7 can be operated in a similar manner to the differential (balanced) attenuator apparatus, for example as described above with respect to FIGS. 13A and 13B.

Figure 14:
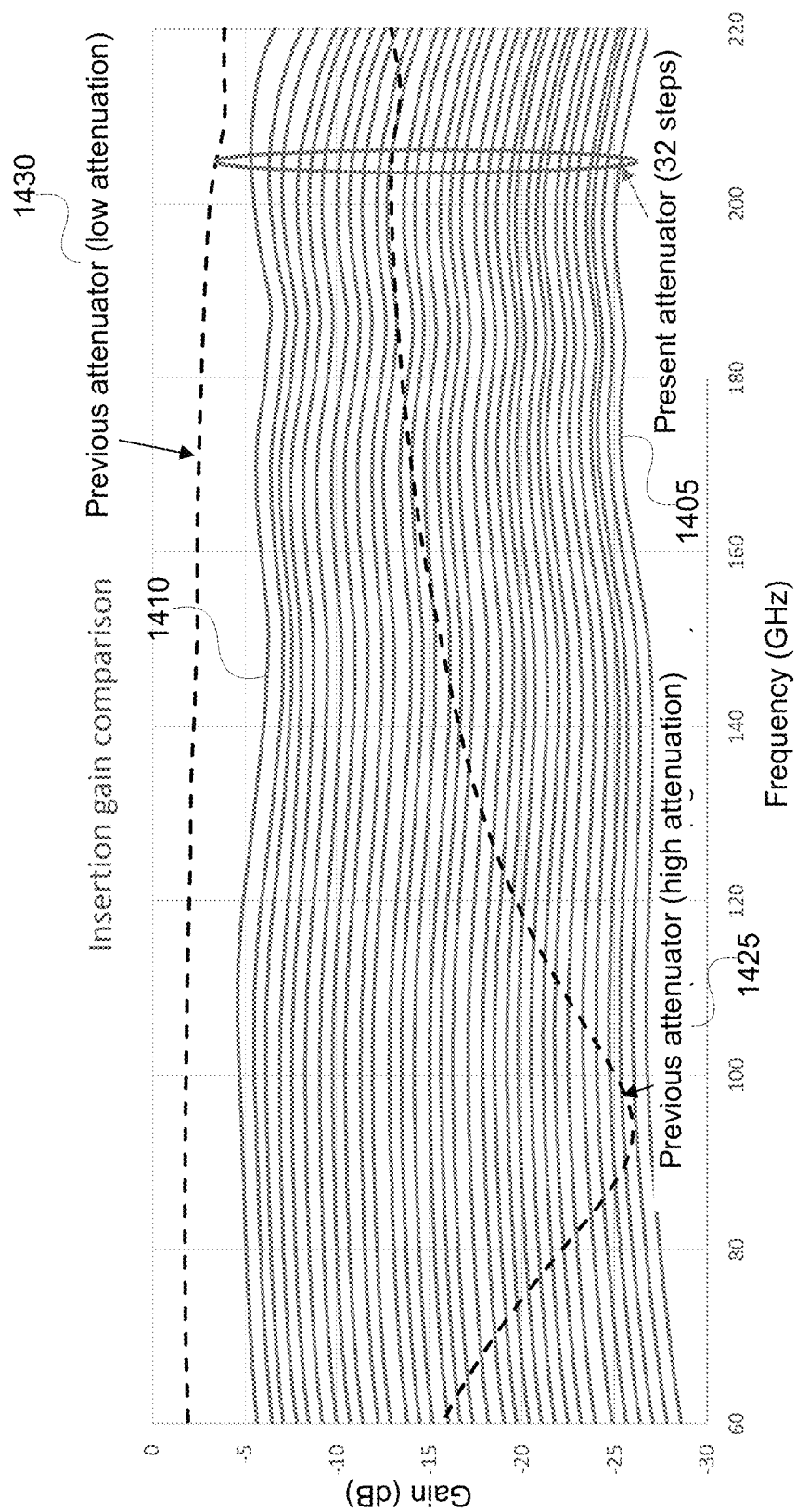
FIG. 14 graphically illustrates a variable attenuation level of the attenuator versus frequency according to an example implementation of the present invention.

It is noted that the attenuator apparatus can be operated in a number of discrete (in the case of digital control), or substantially continuous (in the case of analog control), configurations between the two extreme configurations illustrated in FIGS. 13A and 13B. The equivalent circuit of FIG. 6 illustrates the condition of these intermediate configurations. As shown in FIG. 14, the intermediate configurations result in intermediate gain levels with similar gain vs. frequency characteristics to the two extreme operating configurations. Different configurations can be obtained by providing different control voltage levels of the transistors in the controllable stages, using a control circuit. As will be understood, when progressing from maximum loss to maximum gain, the transistors in the series elements are progressively changed from the fully OFF mode to the fully ON mode, while the transistors in the shunt elements are concurrently progressively changed from the fully ON mode to the fully OFF mode.

FIG. 14 graphically illustrates a gain versus frequency plot for an attenuator apparatus according to an example implementation of the present invention. The gain is negative (in dB) due to the apparatus being an attenuator. Each of the solid plot lines represents the attenuator gain, as a function of frequency, for a different operating configuration, including the maximum loss configuration (lowermost line 1405) and the maximum gain configuration (uppermost line 1410), and a plurality of intermediate configurations.

Figure 1:
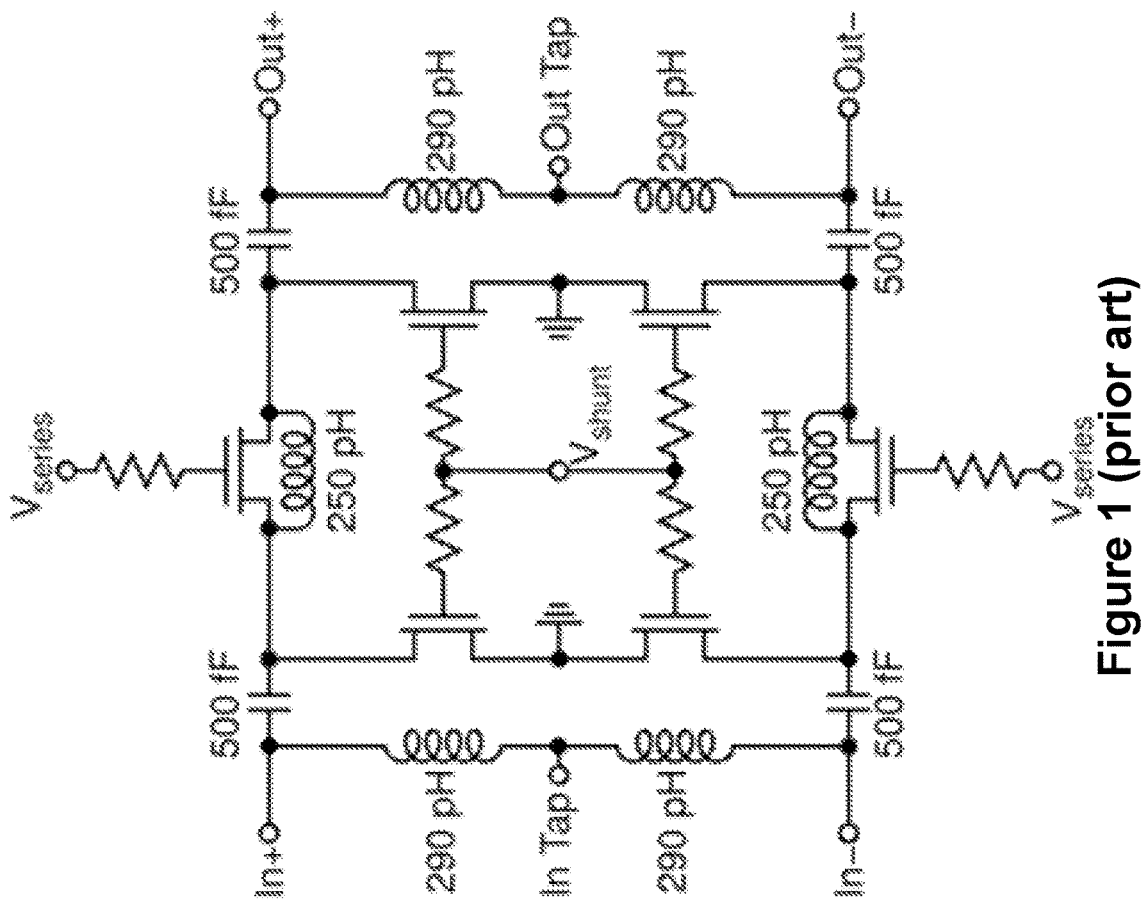
FIG. 1 illustrates a variable loss attenuator previously proposed by the inventors.

For comparison, the minimum and maximum attenuator gains, as functions of frequency, for an implementation of the attenuator illustrated in FIG. 1 are also shown (as dashed lines 1425, 1430) in FIG. 14. Notably, the gain of the attenuator in FIG. 1 varies more strongly and is not flat versus frequency (compared to the illustrated embodiment of the present invention) at high attenuation levels. As such, the attenuator in FIG. 1 has a bandwidth limitation at high attenuations that is not the case in illustrated embodiment of the present invention. Furthermore, the gain versus frequency profile of the attenuator of FIG. 1 changes significantly between high and low attenuation configurations. In other words, for the attenuator of FIG. 1, as attenuation increases, the effective bandwidth decreases.

In contrast, the gain versus frequency profile changes to a significantly lesser extent between high and low attenuation configurations for the illustrated embodiment of the present invention. A more stable gain versus frequency profile across attenuation levels is desirable because it provides a more consistent linearity across multiple attenuation (gain) levels. That is, a wide bandwidth is provided, due to the composite right-hand left-hand distributed attenuator design, with relatively stable (constant) attenuation versus frequency for multiple gain levels. Relatively constant signal gain versus frequency across a wide attenuation range is expected to result in less amplitude and phase error for the variable attenuator. This can be desirable when the attenuator is used in sensitive components such as phase shifters (for which phase error is ideally 0°) and variable gain amplifiers (for which amplitude error is ideally 0 dB). The distributed attenuator can operate such that the highest operating frequency is about 3.5 times higher than the lowest operating frequency (where operating frequencies are defined as the range between upper and lower frequencies) which have a gain/loss which is 3 dB lower than the peak gain/loss.

It is noted that, with respect to FIG. 14, the amount of loss (negative gain) can be adjusted by adjusting the size of the series transistors. For example, the amount of loss can be reduced by increasing the size (i.e. width) of the series transistors. Embodiments of the present invention can incorporate transistor sizes corresponding to a desired range of loss (negative gain) levels. The three-stage attenuator can be made to have less than three times the loss of a single $\pi$ attenuator. In some embodiments, an attenuation range of about 26 dB can be provided, which is appropriate for use with 6-bit vector modulation.

Although embodiments of the present invention have been described with respect to the use of $\pi$ attenuators, it is noted that a cascaded series of combined $\pi$ and T attenuators resembles a cascaded series of $\pi$ attenuators. Therefore, the term $\pi$ attenuator is intended to encompass structures, such as a combination of $\pi$ attenuators and T attenuators, that are operable to provide a variable loss attenuator as described herein.

Although not shown, the attenuator apparatus can include one or more additional DC blocking capacitors (or other filtering elements) connected in series between input terminal and at least one of the series transistor and output terminal and the series transistor. This can be used to bias preceding stages, for example.

Embodiments of the present invention can be used in a variety of applications, for example in integrated circuits for wireless communication devices (e.g. 5G devices), or in other modern transceivers, cellular and non-cellular communication devices (e.g. base stations or mobile devices), or in satellite, wireline, or fiber-based communication devices.

Figure 15:
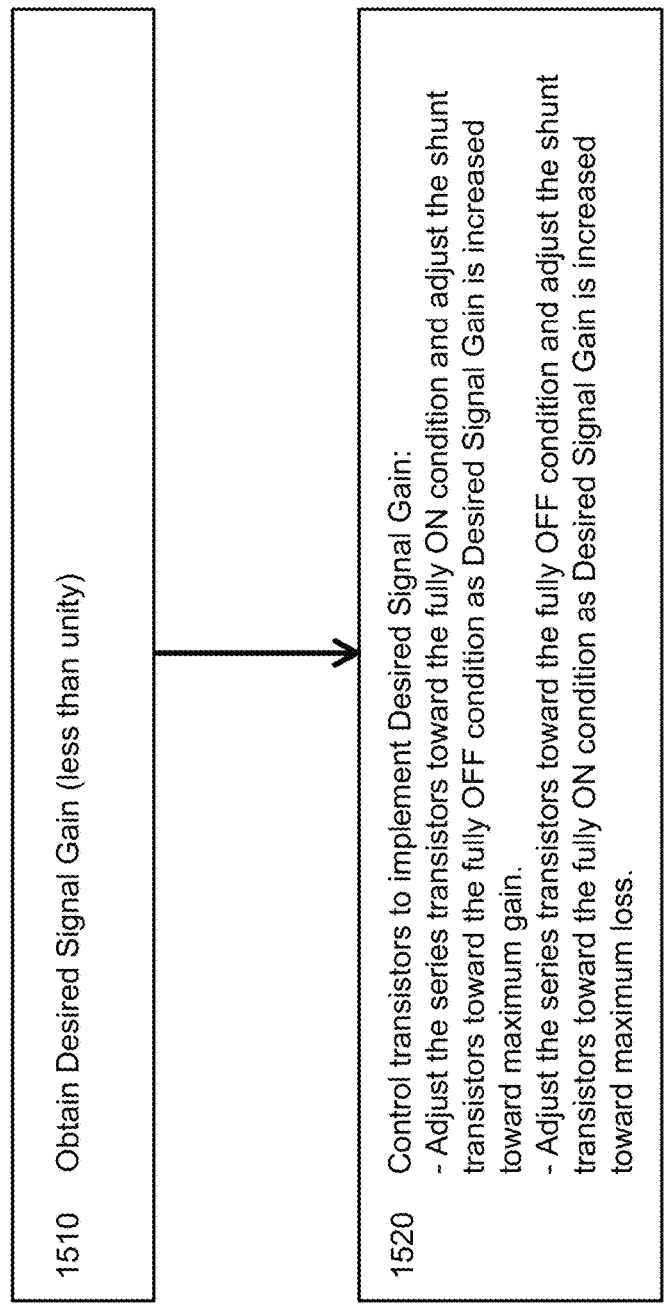
FIG. 15 illustrates a method for operating the described attenuator apparatus, according to an embodiment of the present invention.

FIG. 15 illustrates a method 1500 for operating the variable loss attenuator apparatus as described herein. The method includes obtaining 1510 (e.g. receiving or determining) a desired signal level to be provided by the variable loss attenuator apparatus. The signal level typically corresponds to a gain which is less than unity and which can be expressed in negative dB. The method further includes controlling 1520 the transistors of the attenuator apparatus to implement the desired signal level. The transistors are controlled by adjusting the series transistors toward the fully ON condition and adjusting the shunt transistors toward the fully OFF condition as the desired signal level is increased toward maximum gain. The transistors are further controlled by adjusting the series transistors toward the fully OFF condition and adjusting the shunt transistors toward the fully ON condition as the desired signal level is decreased toward maximum loss. The transistors are controlled by adjusting their gate voltages. The method can be implemented by a suitable control circuit, for example including analog transistor drive components and digital logic control components.

Although the present invention has been described with reference to specific features and embodiments thereof, it is evident that various modifications and combinations can be made thereto without departing from the invention. The specification and drawings are, accordingly, to be regarded simply as an illustration of the invention as defined by the appended claims, and are contemplated to cover any and all modifications, variations, combinations or equivalents that fall within the scope of the present invention.

We claim:

1. A variable loss attenuator apparatus comprising:
a signal input;
a signal output;
two or more controllable stages each comprising:
a differential or single-ended $\pi$ network comprising:
one or more series elements each connected in series between the signal input and the signal output and including at least one respective series transistor without an inductor in parallel with the respective series transistor; and a plurality of shunt elements each including at least one respective shunt transistor;
an input stage comprising a first right-handed transmission line component and coupled between the signal input and a first one of the controllable stages;
an output stage comprising a second right-handed transmission line component and coupled between a last one of the controllable stages and the signal output;
one or more intermediate stages each comprising further respective right-handed transmission line components and coupled between successive ones of the controllable stages; and
a plurality of shunt inductors located at inputs and outputs of each of the two or more controllable stages.

2. The apparatus of claim 1, the apparatus controllable to attenuate an input signal by a controllable amount, wherein, as the controllable amount of attenuation progressively increases, the apparatus acts progressively more as a composite right-handed, left-handed transmission line comprising a left-handed transmission line portion having series capacitance and shunt inductance, wherein the series capacitance is provided using parasitic capacitance of the at least one respective transistor.

3. The apparatus of claim 1, the apparatus controllable to attenuate an input signal by a controllable amount, wherein, as the controllable amount of attenuation progressively increases, the apparatus acts progressively more as a composite right-handed, lossy left-handed transmission line, and as the controllable amount of attenuation progressively decreases, the apparatus acts progressively more as a low-loss right-handed transmission line with shunt parallel LC resonance.

4. The apparatus of claim 1, further configured and controlled so that, when a desired amount of input signal attenuation is low, the series transistors operate substantially as resistors with relatively low resistance thereby mitigating parasitic capacitance of the series transistors, and when a desired amount of input signal attenuation increases, the shunt transistors operate progressively more as shunt resistances.

5. The apparatus of claim 1, wherein some or all of the input stage, the output stage, and the one or more intermediate stages are provided as transmission lines.

6. The apparatus of claim 1, wherein the $\pi$ network is the single-ended $\pi$ network, and wherein the one or more series elements consists essentially of a single series element located between the signal input and the signal output.

7. The apparatus of claim 1, wherein the $\pi$ network is the single-ended $\pi$ network, and wherein each of the plurality of shunt elements consists essentially of a single shunt transistor having one terminal connected to ground.

8. The apparatus of claim 1, wherein the two or more controllable stages consists of three controllable stages.

9. The apparatus of claim 1, wherein the two or more controllable stages comprises four or more controllable stages.

10. The apparatus of claim 1, further comprising a control circuit configured to cause the apparatus to attenuate an input signal by a controllable amount, wherein, as the controllable amount of attenuation progressively increases, the control circuit causes the series transistors to be progressively adjusted toward an OFF condition, and the control circuit causes the shunt transistors to be progressively adjusted toward an ON condition.

11. The apparatus of claim 1, wherein the $\pi$ network is the differential $\pi$ network, and wherein the one or more series elements includes two series elements respectively located on opposing lines of the apparatus between the signal input and the signal output.

12. The apparatus of claim 11, wherein the $\pi$ network is the differential $\pi$ network, and wherein each of the plurality of shunt elements includes two shunt transistors having a virtual ground there between.

13. The apparatus of claim 1, wherein each of the series transistors and each of the shunt transistors is operated as a controllable varistor having parasitic capacitance.

14. The apparatus of claim 13, wherein the series transistors are configured to have a minimum resistance which approaches zero, the shunt transistors are configured to have a minimum resistance which approaches 50$\Omega$, or both.

15. A method for operating the variable loss attenuator of claim 1, the method comprising:
obtaining a desired signal level to be provided by the variable loss attenuator; and
controlling the series transistors and the shunt transistors of the attenuator apparatus to implement the desired signal level.

16. The method of claim 15, wherein controlling the series transistors comprises adjusting the series transistors toward an ON condition and adjusting the shunt transistors toward an OFF condition as the desired signal gain increases toward a maximum gain, and adjusting the series transistors toward the OFF condition and adjusting the shunt transistors toward the ON condition as the desired signal gain decreases toward a maximum loss.

17. A variable loss attenuator apparatus comprising:
a signal input;
a signal output;
two or more controllable stages each comprising:
a differential or single-ended $\pi$ network comprising:
one or more series elements each connected in series between the signal input and the signal output and including at least one respective series transistor without an inductor in parallel with the respective series transistor; and a plurality of shunt elements each including at least one respective shunt transistor;
an input stage comprising a first right-handed transmission line component and coupled between the signal input and a first one of the controllable stages;
an output stage comprising a second right-handed transmission line component and coupled between a last one of the controllable stages and the signal output; and one or more intermediate stages each comprising further respective right-handed transmission line components and coupled between successive ones of the controllable stages;

wherein some or all of the input stage, the output stage, and the one or more intermediate stages are provided using distributed elements, discrete components, or a combination thereof.

18. The apparatus of claim 17, further configured and controlled so that, when a desired amount of input signal attenuation is low, the series transistors operate substantially as resistors with relatively low resistance thereby mitigating parasitic capacitance of the series transistors, and when a desired amount of input signal attenuation increases, the shunt transistors operate progressively more as shunt resistances.

19. The apparatus of claim 17, wherein some or all of the input stage, the output stage, and the one or more intermediate stages are provided as transmission lines.

20. The apparatus of claim 17, wherein each of the series transistors and each of the shunt transistors is operated as a controllable varistor having parasitic capacitance.

\* \* \* \* \*